US011613460B1

(12) United States Patent
English et al.

(10) Patent No.: US 11,613,460 B1
(45) Date of Patent: *Mar. 28, 2023

(54) SYSTEMS, METHODS, AND DEVICES FOR MECHANICAL ISOLATION OR MECHANICAL DAMPING OF MICROFABRICATED INERTIAL SENSORS

(71) Applicants: EngeniusMicro, LLC, Atlanta, GA (US); Auburn University, Auburn, AL (US)

(72) Inventors: Brian A. English, Atlanta, GA (US); Carl Rudd, Huntsville, AL (US); Michael S. Kranz, Huntsville, AL (US); Robert Neal Dean, Jr., Auburn, AL (US); Mark Lee Adams, Auburn, AL (US); Brent Douglas Bottenfield, Auburn, AL (US); Arthur Gernt Bond, III, Auburn, AL (US)

(73) Assignees: EngeniusMicro, LLC, Atlanta, GA (US); Auburn University, Auburn, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/241,148

(22) Filed: Apr. 27, 2021

Related U.S. Application Data

(63) Continuation of application No. 16/593,406, filed on Oct. 4, 2019, now Pat. No. 10,988,375.

(60) Provisional application No. 62/741,108, filed on Oct. 4, 2018.

(51) Int. Cl.
*B81B 7/02* (2006.01)

(52) U.S. Cl.
CPC .................................. *B81B 7/02* (2013.01)

(58) Field of Classification Search
CPC ........ B81B 3/0051; B81B 7/02; B81B 3/0018
See application file for complete search history.

(56) References Cited

U.S. PATENT DOCUMENTS

| 6,583,374 | B2 | 6/2003 | Knieser et al. |
| 6,937,479 | B2 | 8/2005 | Anderson et al. |
| 7,107,840 | B2 | 9/2006 | Foote et al. |
| 7,404,324 | B2 | 7/2008 | Braman et al. |
| 7,410,590 | B2 | 8/2008 | Van Schuylenbergh et al. |
| 7,880,246 | B2 | 2/2011 | Hohfeld et al. |
| 8,129,801 | B2 | 3/2012 | Eskridge |

(Continued)

*Primary Examiner* — Changhyun Yi
(74) *Attorney, Agent, or Firm* — Morris, Manning & Martin, LLP; Daniel E. Sineway, Esq.

(57) ABSTRACT

MEMS-based sensors can experience undesirable signal frequencies caused by vibrations, shocks, and accelerations, among other phenomena. A microisolation system can isolate individual MEMS-based sensors from undesirable signal frequencies and shocks. An embodiment of a system for microisolation of a MEMS-based sensor can include an isolation platform connected to one or more folded springs. Another embodiment of a system for microisolation can include an isolation platform and/or a frame connected to a mesh damping mechanism. In at least one embodiment, a mesh damping mechanism can be a microfibrous metal mesh damper. In one or more embodiments, a system for microisolation can include an isolation platform connected to one or more L-shaped springs, and a thickness of the one or more L-shaped springs can be less than a thickness of the isolation platform.

20 Claims, 24 Drawing Sheets

(56) References Cited

U.S. PATENT DOCUMENTS

| | | |
|---|---|---|
| 8,640,541 B2 | 2/2014 | Abdel et al. |
| 8,896,074 B2 | 11/2014 | Bernstein et al. |
| 9,187,313 B2 | 11/2015 | Eskridge et al. |
| 9,227,833 B2 | 1/2016 | Potaske et al. |
| 9,686,864 B2 | 6/2017 | Walmsley et al. |
| 9,778,039 B2 | 10/2017 | Najafi et al. |
| 10,209,269 B2 | 2/2019 | Tocchio |
| 10,317,211 B2 | 6/2019 | Kim et al. |
| 10,988,375 B1 * | 4/2021 | English ................ B81B 7/0016 |
| 2002/0113191 A1 | 8/2002 | Rolt et al. |
| 2007/0113702 A1 | 5/2007 | Braman et al. |
| 2009/0085191 A1 * | 4/2009 | Najafi .................. B81B 7/0058 438/106 |
| 2014/0001687 A1 | 1/2014 | Braman et al. |
| 2017/0122976 A1 | 5/2017 | Mitchell et al. |
| 2018/0230005 A1 | 8/2018 | Lee et al. |
| 2019/0256348 A1 | 8/2019 | Mitchell et al. |

\* cited by examiner

SYSTEMS, METHODS, AND DEVICES FOR MECHANICAL ISOLATION OR MECHANICAL DAMPING OF MICROFABRICATED INERTIAL SENSORS

CROSS REFERENCE TO RELATED APPLICATIONS

This application is a continuation of U.S. patent application Ser. No. 16/593,406 filed on Oct. 4, 2019, entitled "SYSTEMS, METHODS, AND DEVICES FOR MECHANICAL ISOLATION OR MECHANICAL DAMPING OF MICROFABRICATED INERTIAL SENSORS," which claims the benefit of and priority to U.S. Patent Application No. 62/741,108 filed April Oct. 4, 2018, entitled "SYSTEMS, METHODS, AND DEVICES FOR MECHANICAL ISOLATION OR MECHANICAL DAMPING OF MICROFABRICATED INERTIAL SENSORS," which are incorporated herein by reference in their entirety.

TECHNICAL FIELD

The present systems, methods, assemblies, and devices relate generally to or design and fabrication of micro-electro-mechanical systems (MEMS) or micro- to millimeter-scale mechanical isolation or damping systems, assemblies, and devices (microisolation systems, assemblies, and devices), and more particularly to the design, fabrication, and application of microisolation systems, assemblies, and devices in inertial systems comprised of inertial sensors.

BACKGROUND

Inertial Measurement Units (IMUs) are constrained by limits on size, weight, power, and cost (SWaP-C). IMUs are also exposed to severe shock and vibration environments. This combination of requirements has proven difficult to meet using current inertial sensor technology. IMUs currently employ optical inertial technology to achieve required performance levels, but these are also sensitive to temperature, shock and vibration. Incorporating isolators into the IMU improves IMU performance through shock and vibration, but at the expense of cost and size metrics.

Inertial sensors and IMUs based on micro-electro-mechanical system (MEMS) technologies can improve upon size and cost metrics for volume-constrained applications. MEMS technology has made significant strides in performance in recent years. MEMS-based devices are commonly found in consumer applications for pointing, orientation, and motion tracking. However, MEMS-based IMUs experience performance degradation while operating through high shock and vibration environments. This is particularly problematic for the environments seen by missile defense systems.

As described above, a traditional approach for mitigating shock and vibration in IMU systems is through the application of an isolator separating the IMU housing from the structure onto which it is mounted. However, IMU housings and their isolators are physically large and expensive. They also require significant design compromises to protect all sensors within an IMU housing. A first disadvantage of isolators applied to an IMU housing is that the housing is relatively large and heavy compared to the underlying sensors that require protection. Since the IMU often has significant mass, the isolator needs to be relatively large. Furthermore, the isolator needs to be relatively stiff to maintain a particular frequency and bandwidth. Finally, IMU housings may contain a variety of combinations of internal devices, so isolators need to be custom-designed for each configuration. A second disadvantage to the use of isolation on the IMU housing is that the isolation is generally not customized to the individual sensors, and, thus, mechanical response becomes difficult to optimize for each individual sensor.

Therefore, there is a long-felt but unresolved need for a device, system, or method that can: 1) isolate inertial sensors at the chip-, component-, or sensor level; 2) provide environmental protection to an individual sensor; 3) pass inertial forces within an appropriate frequency band; 4) attenuate unwanted vibrations and frequencies; and 5) minimally impact SWaP-C.

BRIEF SUMMARY OF THE DISCLOSURE

Briefly described, and according to one embodiment, aspects of the present disclosure generally relate to devices, systems, and methods for micro-electro-mechanical systems (MEMS) or micro- to millimeter-scale mechanical isolation or damping systems (microisolation systems), and more particularly to the design, fabrication, and application of microisolation systems in inertial systems comprised of inertial sensors. In at least one embodiment, a system, device, assembly, apparatus, etc. for microisolation, as described herein, may be referred to as a microisolator. For illustrative and descriptive purposes, embodiments of the present systems and methods may be described in the context of a microisolation system for MEMS-based inertial sensors. However, the present systems and methods may also be applied to other MEMS-based devices, packages, printed circuit boards, and substrates. In at least one embodiment, the present systems and methods may be implemented in any suitable microelectronic system that may benefit from and/or require isolation from vibrations, frequencies, and/or shocks.

In at least one embodiment, provided herein are systems and methods for isolating inertial sensors at the chip-, component-, or sensor level. In various embodiments, provided herein is a microisolation system that: 1) provides environmental protection to an individual inertial measurement sensor; 2) passes desired inertial forces within an appropriate frequency band; 3) attenuates unwanted inertial forces (e.g., vibrations, shocks, frequencies, etc.) falling outside of an appropriate frequency band; 4) minimally impacts SWaP-C; and 5) can be configured to provide microisolation according to parameters specific to a particular inertial sensor.

In one or more embodiments, a microisolation system may include, but is not limited to: 1) an isolator platform 2) folded springs oriented in a substantially perpendicular shape and inferior to the isolator platform such that the folded springs intersect multiple planes of the microisolation system; and 3) a mesh providing a damping mechanism.

In at least one embodiment, an isolator platform may hold and support a MEMS-based sensor, such as, for example, an inertial sensor. In various embodiments, the folded springs can attenuate vibrations and frequencies. In at least one embodiment, a thickness of the folded springs can be selected to achieve a desired spring constant, and the desired spring constant may be selected to cause attenuation of specific vibration and frequency ranges (e.g., while passing vibrations and frequencies outside of the ranges). In one or more embodiments, a mesh may provide a damping mechanism by damping and dispersing shocks away from the isolator platform and other elements of the microisolation system. In at least one embodiment, one or more parameters of the mesh may be selected to modify shock absorption behavior. For example, a thickness, density, and/or other parameter of the mesh may be selected to increase or decrease shock absorption behavior. In various embodiments, the mesh includes one or more metal materials (e.g., such as nickel) to avoid off-gassing and other degradation properties that may interfere with sensor performance.

According to a first aspect, an assembly for isolating a MEMS-based sensor, comprising: A) an isolator platform configured to hold a MEMS-based sensor; B) one or more folded springs affixed to the isolator platform; C) a frame affixed to the one or more folded springs; and D) a mesh damper affixed to a bottom surface of the frame.

According to a second aspect, the assembly of the first aspect or any other aspect, wherein the mesh damper is affixed to a substrate.

According to a third aspect, the assembly of the second aspect or any other aspect, wherein the mesh damper comprises a microfibrous mesh.

According to a fourth aspect, the assembly of the third aspect or any other aspect, wherein the microfibrous mesh consists of metal.

According to a fifth aspect, the assembly of the fourth aspect or any other aspect, wherein the metal comprises nickel.

According to a sixth aspect, the assembly of the first aspect or any other aspect, wherein the assembly further comprises: A) an intermediate platform surrounding the isolator platform; B) an outer platform surrounding the intermediate platform; C) one or more springs affixed to and connecting the isolator platform to the intermediate platform; and D) one or more springs operatively connecting the intermediate platform to the outer platform.

According to a seventh aspect, the assembly of the first aspect or any other aspect, wherein the assembly further comprises tuning material disposed between a portion of a top surface of the mesh damper and the bottom surface of the frame.

According to an eighth aspect, the assembly of the seventh aspect or any other aspect, wherein the tuning material modifies a power spectral density and a shock response spectrum of the assembly.

According to a ninth aspect, the assembly of the first aspect or any other aspect, wherein the assembly has a cut-off frequency of about 600 Hz and a sway of at least 400 microns.

According to a tenth aspect, the assembly of the ninth aspect or any other aspect, wherein the assembly has a quality factor of about 5 and a stop band attenuation of about 10×.

According to an eleventh aspect, an assembly for isolating a MEMS-based sensor, comprising: A) an isolator platform configured to support a MEMS-based sensor; B) a frame surrounding the isolator platform; and C) one or more L-shaped springs, wherein: 1) the one or more L-shaped springs are affixed, at a first end, to a side of the isolator platform; and 2) the one or more L-shaped springs are operatively connected, at a second end opposite the first end, to a side of the frame positioned perpendicular to the side of the isolator platform.

According to a twelfth aspect, the assembly of the eleventh aspect or any other aspect, wherein a thickness of the one or more springs is less than a thickness of the isolator platform and less than a thickness of the frame.

According to a thirteenth aspect, the assembly of the twelfth aspect or any other aspect, wherein the one or more springs comprise a spring constant measuring between about 50-150 nm on-axis displacement per 1 G on-axis acceleration and less than about 2.5 nm orthogonal displacement per 1 G on-axis acceleration.

According to a fourteenth aspect, the assembly of the thirteenth aspect or any other aspect, wherein the spring constant is about 50-150 nm per 1 G acceleration.

According to a fifteenth aspect, the assembly of the eleventh aspect or any other aspect, further comprising a mesh damper affixed to the isolator platform.

According to a sixteenth aspect, the assembly of the fifteenth aspect or any other aspect, wherein the mesh damper is affixed to a substrate.

According to a seventeenth aspect, the assembly of the fifteenth aspect or any other aspect, wherein the mesh damper comprises a microfibrous mesh.

According to an eighteenth aspect, the assembly of the seventeenth aspect or any other aspect, wherein the microfibrous mesh consists of metal.

According to a nineteenth aspect, the assembly of the eighteenth aspect or any other aspect, wherein the metal comprises nickel.

According to a twentieth aspect, an assembly for isolating a MEMS-based sensor, comprising: A) an isolator platform configured to hold a MEMS-based sensor; B) a frame affixed to the isolator platform; and C) a microfibrous metal mesh damper affixed to the frame.

According to a twenty-first aspect, a method for manufacturing a microisolator, comprising the steps of: A) orienting a base for adhesion to a mesh damper; B) applying an effective amount of adhesive to a bottom surface of the mesh damper and allowing the effective amount of adhesive to penetrate the mesh damper for a first predetermined period of time, wherein the effective amount of adhesive is in substantially liquid form during application; C) positioning the mesh damper atop the base such that the bottom surface of the mesh damper is substantially in contact with a top surface of the base; D) performing an ovenization process comprising heating the base and the mesh damper to a reflow temperature for a second predetermined period of time; and E) allowing the base and the mesh damper to cool, wherein heating and then cooling the base and the mesh damper causes the mesh damper to bond to the base via the effective amount of adhesive.

According to a twenty-second aspect, the method of the twenty-first aspect or any other aspect, wherein the adhesive comprises solder paste.

According to a twenty-third aspect, the method of the twenty-first aspect or any other aspect, wherein the reflow temperature is between about 150-250 degrees Celsius and the second predetermined period of time is about seven minutes.

According to a twenty-fourth aspect, the method of the twenty-first aspect or any other aspect, wherein the method further comprises the step of, prior to performing the ovenization process, compressing the mesh damper and the base.

According to a twenty-fifth aspect, the method of the twenty-first aspect or any other aspect, wherein performing the ovenization causes the effective amount of adhesive to partially flow onto the base.

According to a twenty-sixth aspect, the method of the twenty-first aspect or any other aspect, further comprising the steps of: A) applying a second effective amount of adhesive to a top surface of the mesh damper and allowing the second effective amount of adhesive to penetrate the mesh damper for the first predetermined period of time, wherein the second effective amount of adhesive is in substantially liquid form during application; B) positioning an isolator platform atop the mesh damper such that a bottom surface of the isolator platform is substantially in contact with the top surface of the mesh damper; C) performing the ovenization process comprising heating the isolation platform, the mesh damper, and the base to the reflow temperature for the second predetermined period of time; and D) allowing the isolation platform, the mesh damper, and the base to cool, wherein heating and then cooling the isolation platform, the mesh damper, and the base causes the mesh damper to bond to the isolation platform via the second effective amount of adhesive.

According to a twenty-seventh aspect, the method of the twenty-sixth aspect or any other aspect, further comprising the step of, prior to performing the ovenization, inverting the isolator platform and the mesh damper such that the isolator platform is positioned inferior to the mesh damper.

According to a twenty-eighth aspect, the method of the twenty-sixth aspect or any other aspect, wherein the method further comprises the step of, prior to performing the ovenization process, compressing the mesh damper and the isolation platform.

According to a twenty-ninth aspect, the method of the twenty-sixth aspect or any other aspect, wherein performing the ovenization causes the second effective amount of adhesive to partially flow onto the isolation platform.

According to a thirtieth aspect, the method of the twenty-sixth aspect or any other aspect, wherein each of the effective amount and the second effective amount of adhesive is between about 2.0-6.0% of a mass of the mesh damper.

According to a thirty-first aspect, the method of the twenty-sixth aspect or any other aspect, wherein each of the effective amount and the second effective amount of adhesive is equal to about 4.1% of a mass of the mesh damper.

According to a thirty-second aspect, the method of the twenty-sixth aspect or any other aspect, wherein each of the effective amount and the second effective amount of adhesive is between about 30-40 mg.

According to a thirty-third aspect, the method of the twenty-sixth aspect or any other aspect, wherein positioning is performed using an alignment article. According to a thirty-fourth aspect, the method of the thirty-third aspect or any other aspect, wherein: A) the alignment article includes an internal cavity for receiving the base, the mesh, and the isolator platform; and B) a shape of the internal cavity, a shape of the mesh, and a shape of the isolation platform substantially conform to a shape of the base.

According to a thirty-fifth aspect, the method of the thirty-fourth aspect or any other aspect, wherein: A) the alignment article includes metal conductors for providing electrical connections to the isolation platform; B) the alignment article comprises an electronics package; and the alignment article is retained following the ovenization process.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
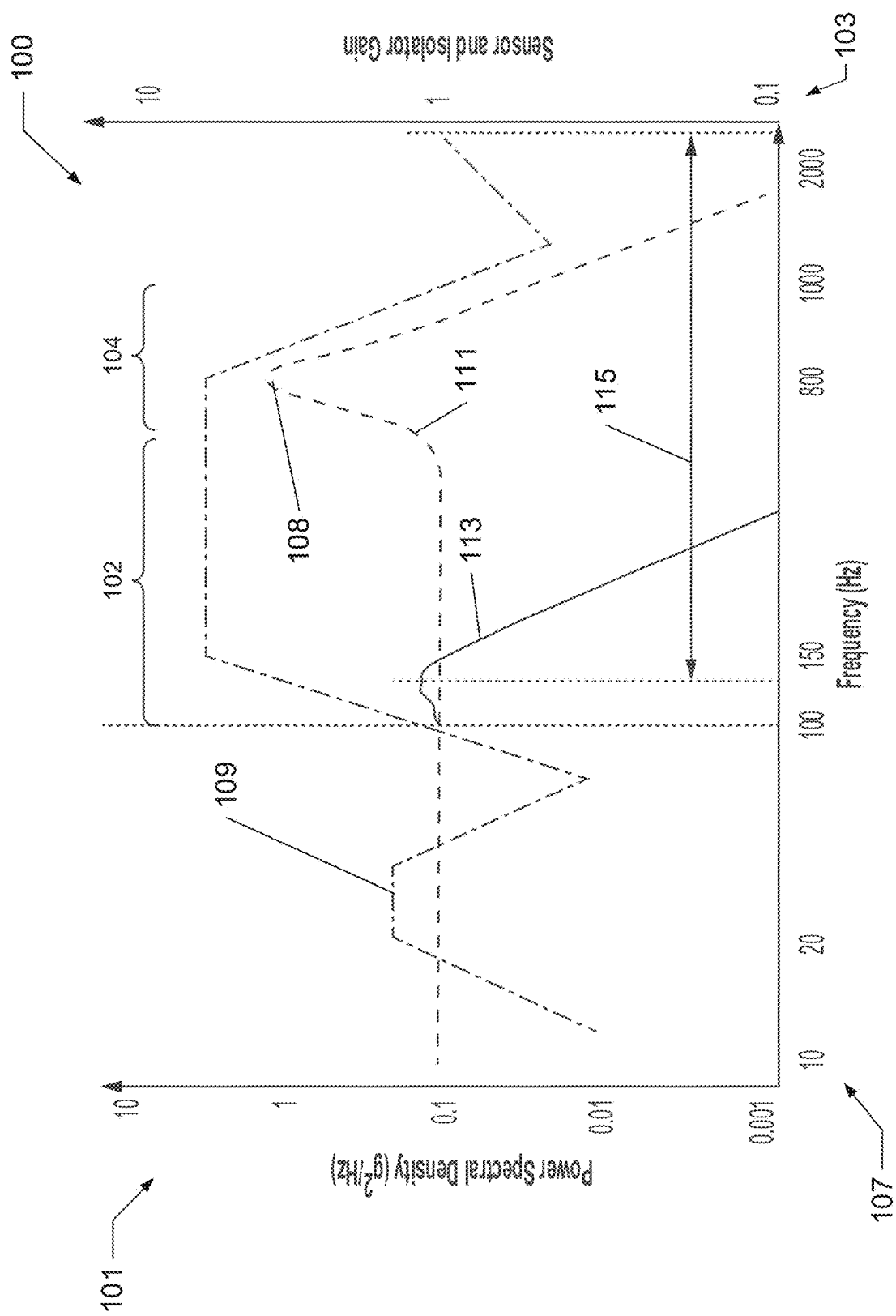
FIG. 1 is a chart illustrating an exemplary vibration power spectral density and isolator frequency response, according to one embodiment of the present disclosure.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

Overview

Aspects of the present disclosure generally relate to devices, systems and methods for micro-electro-mechanical systems (MEMS) or micro- to millimeter-scale mechanical isolation or damping systems (microisolation systems).

The new approach described herein uses MEMS technology to fabricate microisolation systems that are applied and/or customized at the sensor level to remove unwanted shock and vibration signals without compromising the size, weight, power, and cost (SWaP-C) benefits of MEMS devices. This technology permits the application of devices that meet measurement requirements beyond their original environmental performance.

In at least one embodiment, the present disclosure relates to microisolation technology for MEMS inertial sensors and inertial measurement units (IMUs). In one or more embodiments, in the microisolation approach, a MEMS-based silicon interposer (referred to as a "microisolation system" herein), with customized dynamic properties, separates the MEMS inertial sensor from its package, and, thus, the external environment. In various embodiments, the microisolation system passes lower frequency vibrations and accelerations while filtering out large higher frequency components. In at least one embodiment, the microisolation system may also include a damping mechanism, such as, for example, mesh that can provide shock absorption and/or frequency or vibration attenuation.

In at least one embodiment, a microisolation system may include, but is not limited to, a micromachined spring structure and a central isolation platform connected to a surrounding platform or frame by multiple flexures (e.g., springs included in the spring structure). In various embodiments, inertial sensors can be attached to the central isolation platform. In an exemplary scenario, the microisolation system can replace static die attach processes currently in use by MEMS sensors with a microisolation system that provides shock and vibration isolation. In some embodiments, the microisolation system can be attached to a vacuum-compatible damping mechanism, such as a mesh, and the microisolation system can be mounted in an electrical package. In one or more embodiments, a damping mechanism may be a patterned or unaltered microfibrous metal (MFM) mesh with a surface structured attached to the central isolation platform and/or other components of the microisolation system. In at least one embodiment, the microisolation system may be an underdamped second order isolator, and the damping mechanism may transition the microisolation system to a more heavily damped isolator.

In one or more embodiments, flexible electrical traces can connect an electrical package to a frame or other component of the microisolation system. In at least one embodiment, the microisolation system may include conductive thin film surface traces located along frames, springs, and/or other components to landings on the central isolation platform for electrical connection to a sensor attached thereon. In one or more embodiments, the microisolation system can provide benefits including, but not limited to, isolation from stress gradients that induce errors, as well as an ability to serve as a platform for sensor thermal control and/or ovenization. In various embodiments, the microisolation system may be suitable for use with all MEMS inertial sensors, whether in individual or multiple sensor configurations.

Advantages of Micro-Isolators

In one or more embodiments, the microisolation system described herein may present several advantages over traditional isolators, as well as over other shock and vibration mitigation systems and approaches, as listed in the following:

1. Embodiments of the present microisolation system can be specific for each sensor, allowing customization for the needs of that sensor.
2. Embodiments of the present microisolation system are sensor agnostic. A wide variety of sensors can be isolated by the microisolation system.
3. Embodiments of the present microisolation system remove shock and vibration signals that are not of interest, improving overall performance by eliminating or attenuating signals that are not useful and/or may damage a sensor.
4. Embodiments of the present microisolation system can keep all sensors operating in their linear ranges, even while undergoing heavy shock and vibration environments.
5. Embodiments of the present microisolation system can be utilized in conjunction with the other potential mitigation approaches.
6. Embodiments of the present microisolation system can be realized with improvements or minimal impact on SWaP-C.
7. Embodiments of the present microisolation system can provide multi-stage isolation that is not available in traditional isolation approaches.
8. Embodiments of the present microisolation system can be extended to perform thermal and strain isolation, as well as incorporating features for ovenization of an inertial sensor.
9. Embodiments of the present microisolation system applied to MEMS IMUs can result in improved shock and vibration attenuation, without the additional size and cost factors associated with discrete isolators.
10. Embodiments of the present microisolation system, when fabricated using MEMS technologies, can be realized in batches at high-yield and low cost.
11. Embodiments of the present microisolation system can be individually optimized for use with any number of different accelerometers and gyroscopes, making the microisolation system a multi-purpose technology.

Micro-Isolator Challenges

In various embodiments, to develop the present microisolation system, one or more challenges were overcome including the following:

(1) The design and fabrication process for embodiments of the present microisolation system were optimized to yield suitable isolation performance in a form factor that is like the isolate-device itself.

(2) Design of embodiments of the present microisolation system were optimized to meet sensor specifications on natural frequency, damping factor, center of elasticity, sway, and attenuation, amongst other requirements.

(3) Many high-performance MEMS sensors are packaged in a vacuum; therefore, embodiments of the present microisolation system were designed to be vacuum compatible, including any damping mechanisms included therein.

(4) The properties of embodiments of the present microisolation system were optimized be stable over the device lifetime.

Mathematical Models of Isolation Performance

In at least one embodiment, modeling and experimentation was used to demonstrate sufficient isolator performance. Analytical modeling provided general guidance for the design and performance tradeoffs, while finite element analysis (FEA) provided a higher level of fidelity (e.g., signal quality). The resulting models were used to determine the microisolation system geometries, electrical specifications, and damping requirements necessary to meet challenges, objectives, and parameters described herein.

In at least one embodiment, development included designs for both planar and folded microisolation systems. In at least one embodiment, a planar microisolation system has springs at the same plane as the central isolation platform. In one or more embodiments, the planar microisolation system was capable of a 400 Hz cut-off frequency with over 500-microns of sway. In at least one embodiment, the planar microisolation system (including a microfibrous metal mesh) demonstrated frequency attenuation with a clear pass-band and frequency cut-off, thereby demonstrating frequency attenuation using an embodiment of the microisolation system.

In various embodiments, the folded microisolation system has the springs "folded" underneath the central isolation platform and has an anchor in the center (e.g., in some embodiments, instead of an outer frame, outer frame, platform, or fixture). In one or more embodiments, the folded microisolation system is more space-efficient. In at least one embodiment, the folded microisolation system was capable of a 600 Hz cut-off frequency with over 400-microns of sway. In one or more embodiments, simulated microisolation system performances achieved 10× isolation in stop band.

MEMS Fabrication

Generally, new process approaches were used to implement damping approaches and three-dimensional isolation properties to microisolation systems as described herein. In at least one embodiment, development expanded process flow while maintaining manufacturability.

In one or more embodiments, a fabrication process was designed to realize a planar microisolation system and realize the folded microisolation system. In various embodiments, the folded microisolation system may demonstrate a significantly reduced overall footprint (e.g., compared to a planar system and previous solutions for isolation), thereby making the folded microisolation less expensive to fabricate and advantageously reducing SWaP-c.

Demonstration of Vibration and Shock Performance of Resonant MEM Sensors

One embodiment of the present technology uses microisolation systems to reduce shock and vibration experienced at a sensor, and also uses robust resonant MEMS sensor architectures to improve in-band vibration and shock performance, thereby addressing isolation from two approaches. In one or more embodiments, through a combination of simulation and experimentation, inherent shock and vibration advantages of the present technology were demonstrated through simulation and experimental evaluation of prototypes (e.g., microisolation system models).

Figure 20:
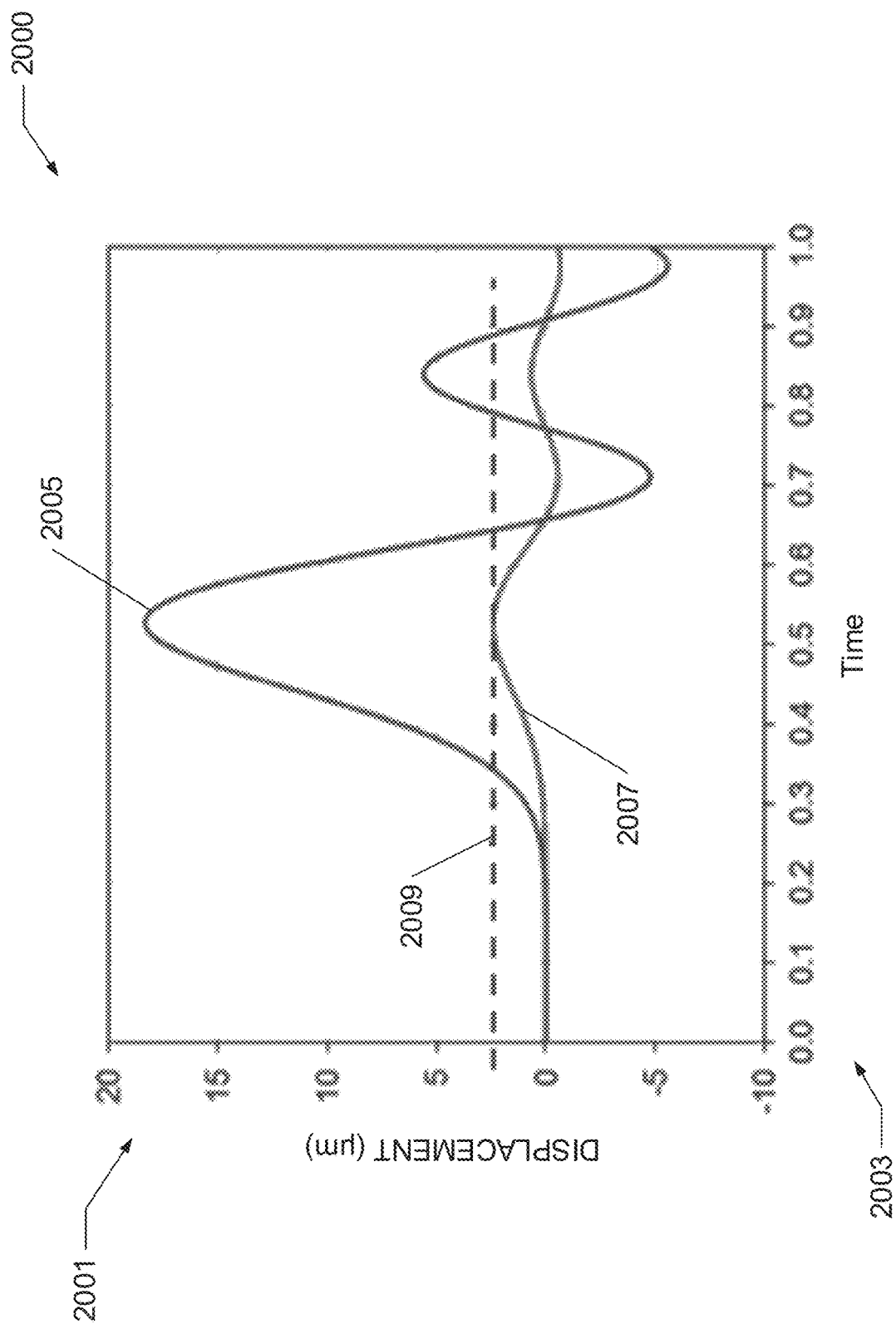
FIG. 20 is a chart illustrating a finite element analysis model for displacements experienced by inertial sensor models, according to one embodiment of the present disclosure.
Figure 21:
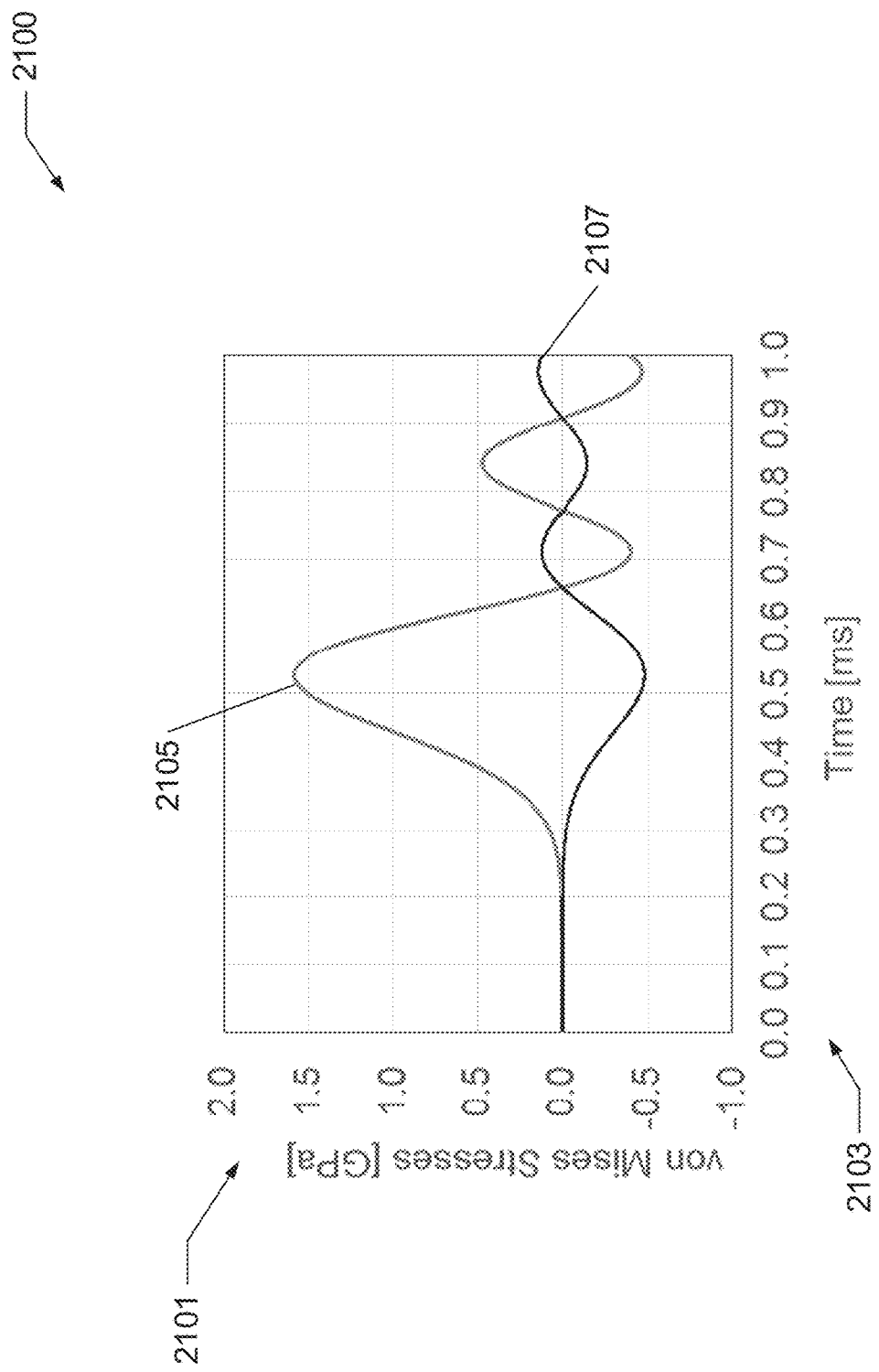
FIG. 21 is a chart illustrating a finite element analysis model for stresses experienced by inertial sensor models, according to one embodiment of the present disclosure.
Figure 22:
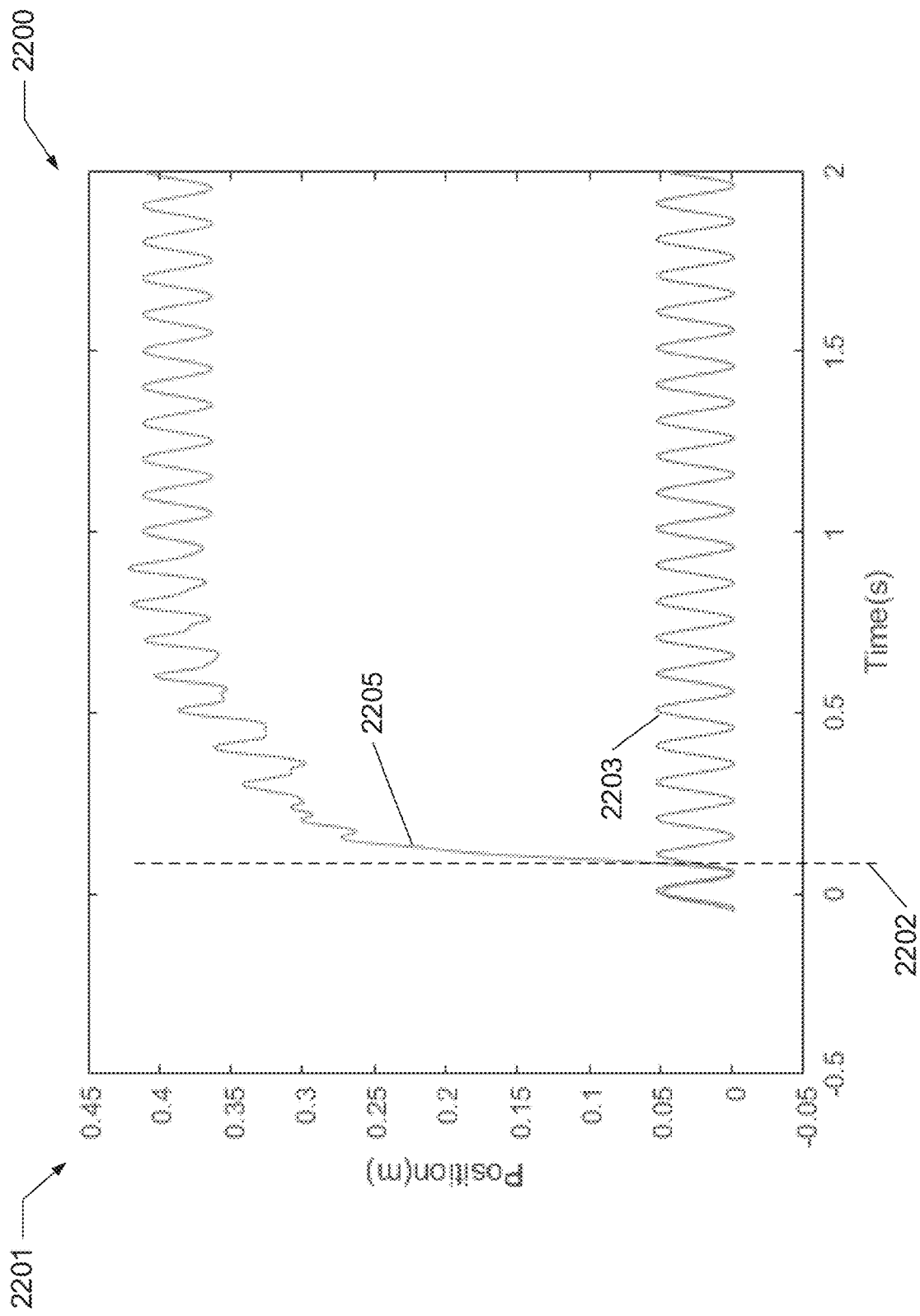
FIG. 22 is a chart illustrating position errors of isolated and un-isolated inertial sensor models, according to one embodiment of the present disclosure.

In at least one embodiment, finite element analysis (FEA) models of MEMS inertial sensors were developed to evaluate performance issues under shock and vibration. In various embodiments, as shown in FIG. 20, FEA models of inertial sensors experience excessive motion that leads to saturation of the sensor. In at least one embodiment, the saturation represents motion beyond the detection range of the sensor. In one or more embodiments, as shown in FIG. 21, there are also significant stress levels developed under these shock loads. In at least one embodiment, as shown in FIG. 22, simulations determined that an attenuation of 10× would enable stable sensor operation through shock and vibration loads.

In various embodiments, models of sensors were developed to investigate failure mechanisms under expected shock and vibration loads. In at least one embodiment, as shown in FIG. 22, simulations demonstrated that coupling between the orthogonal modes of the sensor led to errors in sensor output under large shock events. According to one embodiment, sensors designed to sense forces in a preferred direction can be sensitive to forces with directions ranging from a few degrees "off-axis" to fully-orthogonal directions. In one embodiment, sensitivity to off-axis forces may referred to as cross-sensitivity. In one or more embodiments, orthogonal and other off-axis forces from shocks and other stimuli may impart significant forces in the preferred sensing direction causing sensor measurement error, for example as shown in FIG. 22. In various embodiments, the present systems, assemblies, devices, etc. can attenuate cross-axis forces and effects to maintain measurement accuracy, for example as shown in FIG. 22. In at least one embodiment, the simulations provided additional evidence that 10× out-of-band attenuation provided significant isolation.

Development of Predicted Performance Levels

In one or more embodiments, the above-described activities and developments demonstrated performance improvements for a MEMS IMU utilizing resonant MEMS technology and MEMS microisolation systems. In at least one embodiment, for the microisolation system itself, an objective was to achieve suitable isolation performance in a form factor suitable for co-packaging with the MEMS inertial sensor. In various embodiments, tasks performed to demonstration completion of the objective included fabricating test articles to validate model assumptions, modeling microisolation system performance, incorporating performance estimates into existing models for MEMS sensor operation, performing initial experiments to validate the models, and generating performance predictions.

Figure 23:
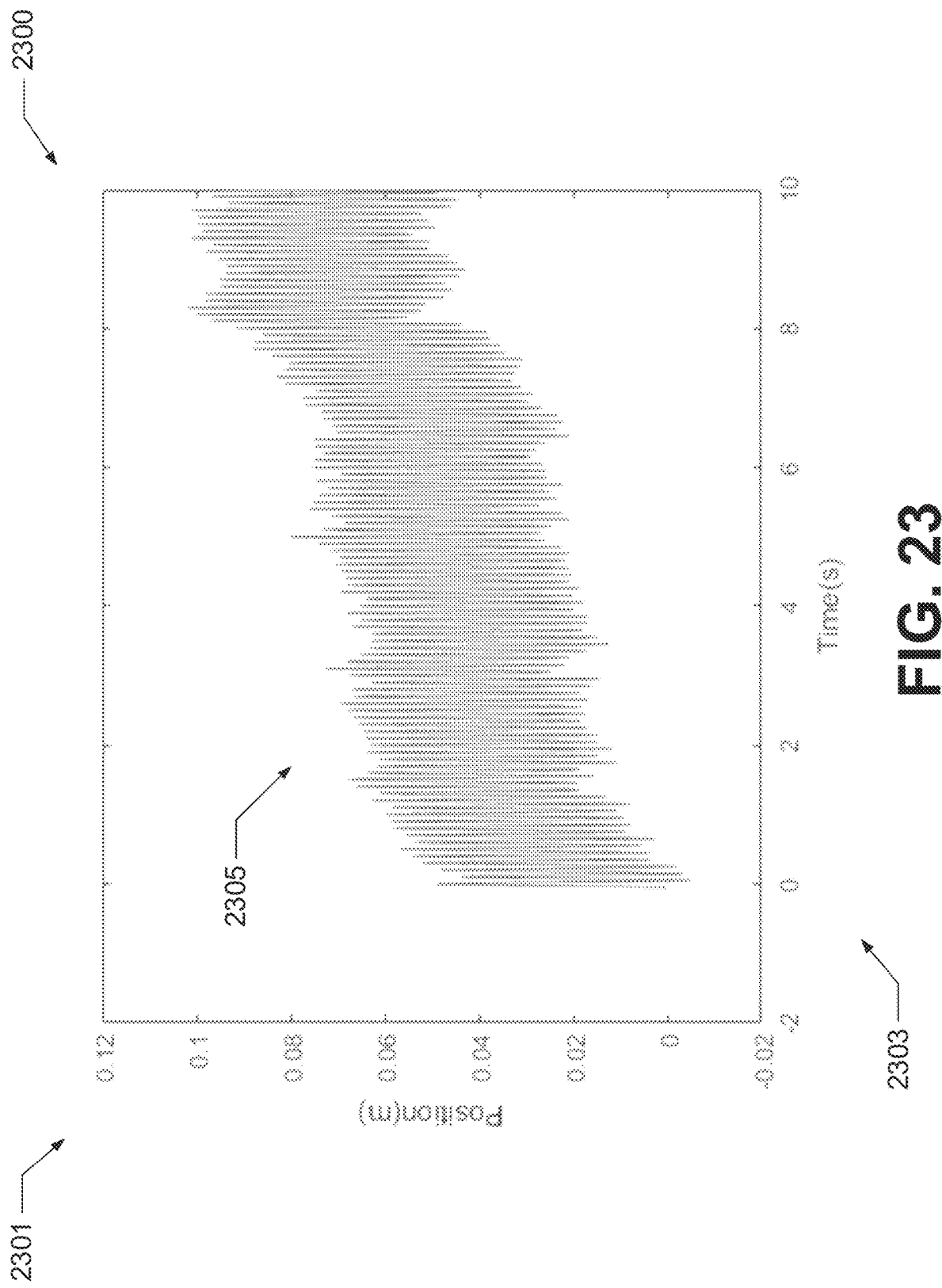
FIG. 23 is a chart illustrating position error of an un-isolated inertial sensor model.
Figure 24:
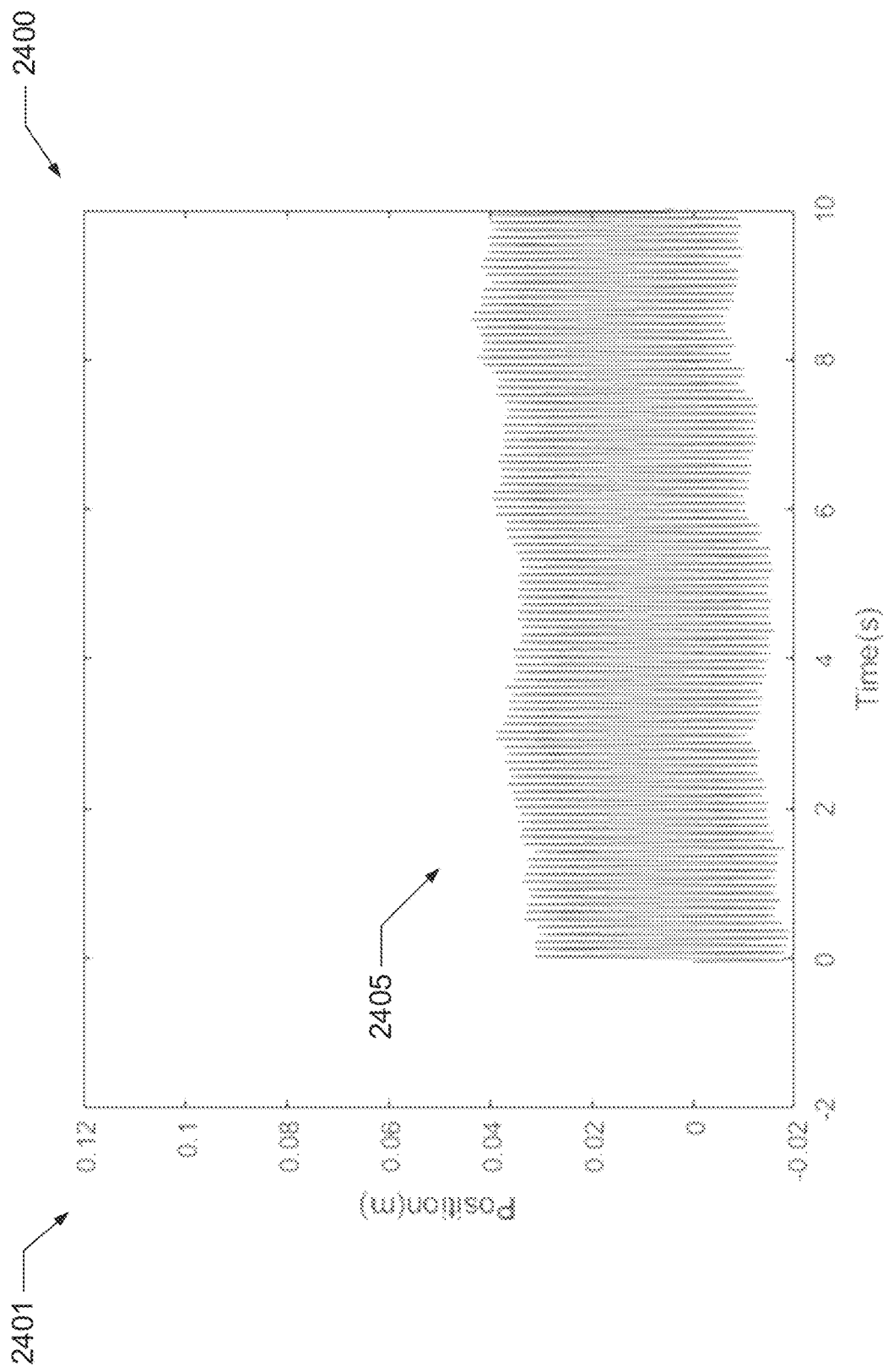
FIG. 24 is a chart illustrating position response of an isolated inertial sensor model, according to one embodiment of the present disclosure.

In at least one embodiment, the models and simulations of the MEMS inertial sensors suggested the need to achieve 10× attenuation in the stop band, with a cut-off frequency of approximately 400 Hz, and a quality factor of less than 5. As described herein, a quality factor may generally refer to a dimensionless parameter that describes how underdamped an isolation system is, and characterizes an isolation system's bandwidth relative to its center frequency. As shown in FIG. 22, a shock input to an un-isolated sensor led to a large position error compared to that of a sensor isolated with an embodiment of the present microisolation system. As shown in FIGS. 23 and 24, similar trends existed for random vibration, with an isolated sensor maintaining bias through the vibration event, while a non-isolated sensor demonstrated large and increasing position errors.

In summary, development and activities described herein demonstrated the feasibility of achieving high-g MEMS IMU operation using a combination of sensor design and microisolation techniques.

Inertial Sensor Performance

In various embodiments, performance requirements for a MEMS IMU can be exemplified by a set of tactical-grade IMUs, as shown in Table 1. In one or more embodiments, tactical-grade IMUs may utilize millimeter-to-centimeter-scale servo-accelerometers and optical gyros. For example, an IMU may utilize ring laser gyroscopes (RLG). As another example, an IMU may utilize servo-accelerometers. In another example, an IMU may utilize fiber-optic gyroscopes (FOG) and MEMS accelerometers. In at least one embodiment, application of MEMS accelerometers may result in reductions to SWaP-C compared to the embodiments utilizing millimeter-to-centimeter-scale servo-accelerometers and laser gyroscopes. As another example, an IMU can include MEMS-based sensors including MEMS-based accelerometers and gyroscopes, which may result in further SWaP-C reductions.

TABLE 1

Representative IMU Performance Specifications

| | RLG | Servo-Accelerometer | FOG + MEMS Accelerometer | MEMS Accelerometer + MEMS Gyroscope |
|---|---|---|---|---|
| Accelerometer | | | | |
| Range | +/− 50 g | +/− 60 g | +/− 40 g | +/− 30 g |
| Bias | 2.0 mg | 1.0 mg | 0.3 mg | 0.5 mg |
| Scale Factor | 300 ppm | 300 ppm | 300 ppm | 300 ppm |
| Gyro | | | | |
| Range | +/− 1,000°/s | +/− 2,000°/s | +/− 1,000°/s | +/− 1,000°/s |
| Bias | 5°/hour | 0.5/hour | 1°/hour | 2°/hour |
| Scale Factor | 150 ppm | 150 ppm | 100 ppm | 300pm |
| ARW | 0.5°/rt.hour | 0.5°/rt.hour | 0.07°/rt.hour | 0.175°/rt.hour |
| Volume | 3223 cc | 508 cc | 673 cc | 58.8 cc |

In one or more embodiments, traditional MEMS-based sensors may demonstrate slightly worse accelerometer performance compared to servo-accelerometers and significantly worse gyroscope performance compared to RLGs. In one or more embodiments, the present microisolation systems and methods can provide for MEMS-based sensors satisfying performance levels exemplified in Table 1 and/or associated with typical operational environments.

In various embodiments, high-performance MEMS accelerometers and gyroscopes utilize a large proof masse and/or sensitive detection scheme to achieve high-resolution measurement of linear acceleration. The large proof mass improves sensor resolution because the mass will displace a greater distance for a fixed small change in acceleration. While large proof masses and deflections improve performance, the structure becomes more susceptible to mechanical failure under high shock and vibration loads. So, devices designed to meet resolution performance requirements will fail to meet environmental requirements.

Shock Vibration Requirements

Figure 2:
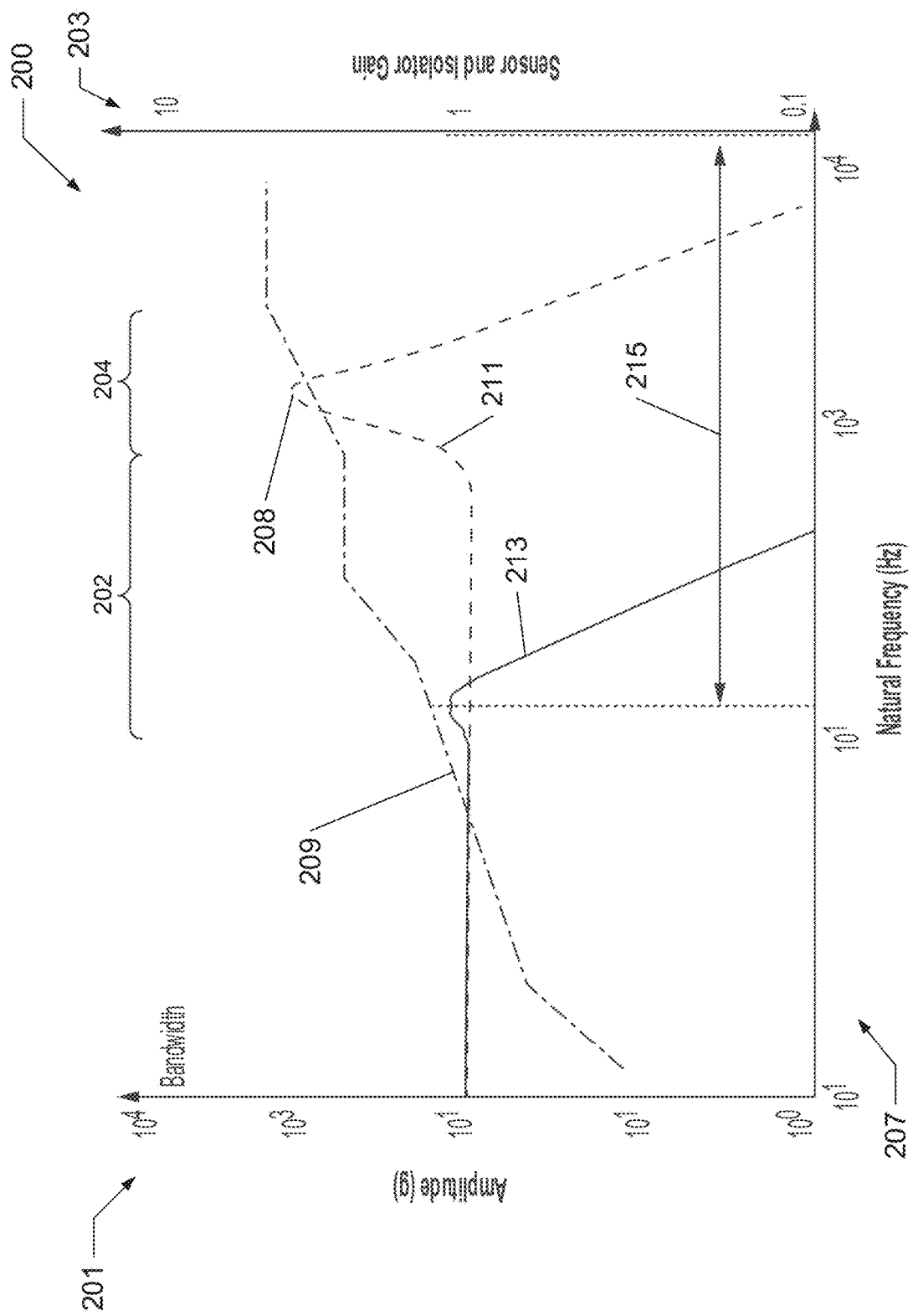
FIG. 2 is a chart illustrating an exemplary shock response spectrum and isolator frequency response, according to one embodiment of the present disclosure.

Multiple sources or requirements define the typical shock and vibration environment seen by an IMU in a missile defense system. For example, FIGS. 1 and 2 shows the vibration power spectral density (PSD) and shock response spectrum (SRS) levels that may be applied to setting environmental requirements. In FIGS. 1 and 2, superimposed over the PSD and SRS are a typical measurement bandwidth for an inertial sensor. In at least one embodiment, the sensors must have the operational range within the measurement bandwidth to accurately capture in-band shocks and vibrations. However, unwanted and spurious signals outside the measurement bandwidth can lead to measurement error or mechanical fracture.

In various embodiments, characteristics of high performance MEMS inertial devices lead to high environmental sensitivity. In at least one embodiment, the sensors are typically underdamped second-order systems with high quality factors. In one or more embodiments, high-quality factors lead to harmonic vibrations, "ringing", under shock loads. In various embodiments, the ringing generally amplifies displacements, which leads to mechanical sensor failure from excessive strain in an over-displaced sensor component. In previous approaches, the large proof masses employed in the sensors lead to large deflections that improve detection but increase deflections under shock and vibration loads.

In one or more embodiments, stiffening a structure to reduce total deflection can require high sensitivity deflection measurements. In at least one embodiment, sensitive displacement measurements may require small gaps between components and tight tolerances. In various embodiments, the stiffened structure may also be sensitive to environmental issues, such as thermal noise and mechanical vibrations, and may require significant external components and electronics for signal processing.

Random vibrations are a source of environmental error. A common issue for both MEMS accelerometers and gyros occurs when random vibrations are near a natural resonant frequency of the sensor structure. In various embodiments, underdamped second-order systems amplify displacements when excited near their natural frequency. In at least one embodiment, the amplification response must be accommodated by the mechanics of the sensor structure as well as the control system used to null proof mass position. In one or more embodiments, the situation can be improved, for example, if the resonant frequency of the sensor structure, or the sensor's measurement bandwidth, can be moved to frequencies significantly higher than those of the random vibrations. However, in at least one embodiment, this may reduce sensor performance, because higher natural frequencies may result from the stiffer sensor structure, which may be less sensitive to accelerations.

In at least one embodiment, from the perspective of shock, a performance issue for accelerometers and gyros is for frequencies near the resonance of the device. In one or more embodiments, when the shock response spectrum (SRS) includes frequencies above resonance, the second-order system will "ring", and in the absence of other mitigating factors, the control system and signal processing for the device will need to accommodate this ringing. Furthermore, in various embodiments, mechanical structures of a MEMS device and its packaging can be vulnerable to high frequency components of the SRS, as well as large random vibrations. In some cases, the mechanical structures can displace to their extreme limits, leading to nonlinear operation or mechanical failure if there are manufacturing defects or if the deflection of the structure exceeds the designed range.

Methods to Mitigate Shock and Vibration Error

In at least one embodiment, a potential method to improve the operation of MEMS inertial sensors may be to increase the range of the sensors to accommodate a maximum anticipated range. In one or more embodiments, dynamic range, defined as the measurement range of a sensor divided by its resolution, can be an important requirement in sensor performance, and can be difficult to improve. In various embodiments, increasing the range of the sensor typically involves decreasing the resolution performance, which reduces the dynamic range. For example, in the case of MEMS gyroscopes, the relationship between rotation measurement performance and g-sensitivity can be complex; however, decreasing g-sensitivity may cause a reduction in rotation measurement performance.

In one or more embodiments, a second potential method for reducing MEMS IMU shock and vibration sensitivity may be to apply multiple sensors in an array covering different ranges of shock and vibration levels. In at least one embodiment, signal processing may be used to stitch together inertial measurements from sensors in the array that are not saturated or operating nonlinearly. In various embodiments, the larger range, yet lower performance, sensors continue operating during the shock and vibration events while lower range, yet higher performance, sensors are saturated. In one or more embodiments, because the high-performance sensors may be saturated for only relatively short periods, the poor performance of the higher range sensors, once integrated, may lead to only small errors in sensor measurements (e.g., and, for example, guidance information derived therefrom).

In at least one embodiment, the range and/or array method may be applicable to accelerometers, because the shock and vibration can be accommodated by increasing the range of the accelerometer, at least along a measurement axis. However, the method cannot necessarily be applied to MEMS gyroscopes because of the gyroscopes' sensitivity to shock and vibration may lend to an unclear and/or complex relationship with the gyroscopes' g-sensitivity. In various embodiments, the g-sensitivity of a MEMS gyroscope is a second-order effect that is often a result of the design architecture. In one or more embodiments, in cases where the use of a sensor array is a viable method, the approach may demonstrate disadvantages including the need for additional power, size, and cost to accommodate the required additional electronics and signal processing.

In at least one embodiment, a third potential method may use materials and structures to change the mechanical response of a sensor system or device, and improve operation over shock and vibration environments. In one or more embodiments, isolation systems attenuate mechanical shock and vibration that are outside a prescribed frequency and bandwidth, while passing in-band shock and vibrations to an isolated sensor therein. However, in various embodiments, a first disadvantage of isolation systems applied to an IMU housing is that the housing is relatively large and heavy compared to the underlying sensors that require protection. For example, since the IMU has significant mass, the isolation system needs to be relatively large. In the same example, the isolation system needs to be relatively stiff to maintain a particular frequency and bandwidth. Continuing the same example, IMU housings may contain a variety of configurations of internal devices; therefore, isolation systems may need to be custom-designed for each configuration. In at least one embodiment, a second disadvantage to the use of isolation systems on the IMU housing is that the isolation is not customized to the individual sensors, meaning that resulting mechanical response is difficult to optimize for each individual sensor.

EXEMPLARY EMBODIMENTS

Referring now to the figures, for the purposes of example and explanation of the fundamental processes and components of the disclosed systems and methods, reference is made to FIG. 1, where a chart 100 is shown. In at least one embodiment, the chart 100 relates power spectral density (PSD) 103 and gain 105 to frequency 107. In one or more embodiments, the chart 100 may include a PSD curve 109, a sensor response curve 111, and an isolator response curve 113. In various embodiments, chart 100 includes a stop band 115, spanning about 120-2000 Hz, that includes a signal rejection region 102 and a resonance avoidance region 104. In one or more embodiments, the isolator response curve 113 and the associated stop band 115 demonstrate exemplary performance of embodiments of the systems for microisolation described herein.

In various embodiments, the chart 100 demonstrates a PSD response provided via the present systems for microisolation. In at least one embodiment, the PSD curve 109 includes the signal rejection region 102 occurring between about 100-800 Hz, and the resonance avoidance region 104 occurring between about 800-1000 Hz. In one or more embodiments, the region 102 and region 104 are areas of the PSD curve 109 in which the PSD 103 of a sampled signal is greatest. According to one embodiment, to provide microisolation as described herein, a microisolation system would seek to attenuate signal occurring in the region 102 and the region 104, because the PSD 103 of sampled signal in these areas may damage a sensor, or otherwise interfere with accurate and precise signal measurement (for example, signals in the frequencies 107 of the region 102 may obfuscate desired signals occurring at other frequencies 107).

In various embodiments, as described herein, the sensor response curve 111 can demonstrate an undesirable resonance peak 108 in the PSD 103 at the region 104. In various embodiments, to prevent the resonance peak 108, the isolator response curve 113 demonstrates, in the stop band 115, an appropriate attenuation (e.g., at least 10×) of signal in the region 102 and the region 104. In at least one embodiment, the attenuation of frequencies in the stop band 115 can advantageously isolate a sensor from the high-PSD 103 regions of the PSD curve 109, while allowing a sensor to receive desired signal occurring at frequencies 107 outside of the stop band 115.

With reference to FIG. 2, shown is a chart 200. In at least one embodiment, the chart 200 relates amplitude 203 and gain 205 to frequency 207. In one or more embodiments, the chart 200 may include a shock response spectrum (SRS) curve 209, a sensor response curve 211, and an isolator response curve 213. In various embodiments, chart 100 includes a stop band 215, spanning about 150-10,000 Hz, that includes a signal rejection region 202 and a resonance avoidance region 204. In one or more embodiments, the isolator response curve 213 and the associated stop band 215 demonstrate exemplary performance of embodiments of the systems for microisolation described herein.

In various embodiments, the chart 200 demonstrates a SRS response provided via the present systems for microisolation. In at least one embodiment, the SRS curve 209 includes the signal rejection region 202 occurring between about 150-1000 Hz, and the resonance avoidance region 204 occurring between about 1000-5000 Hz. In one or more embodiments, the region 202 and region 204 are areas of the SRS curve 209 in which the amplitude 203 of a sampled signal is greatest. According to one embodiment, to provide microisolation as described herein, a microisolation system would seek to attenuate signal occurring in the region 202 and the region 204, because the amplitude 203 of sampled signal in these areas may damage a sensor, or otherwise interfere with accurate and precise signal measurement.

In various embodiments, as described herein, the sensor response curve 211 can demonstrate an undesirable resonance peak 208 in the amplitude 203 at the region 204. In various embodiments, to prevent the resonance peak 208, the isolator response curve 213 demonstrates, in the stop band 215, an appropriate attenuation (e.g., at least 10×) of signal in the region 202 and the region 204. In at least one embodiment, the attenuation of frequencies 207 in the stop band 115 can advantageously isolate a sensor from the high-amplitude 203 regions of the SRS curve 209, while allowing a sensor to receive desired signal occurring at frequencies 207 outside of the stop band 115.

Description will now be made of various microisolation system embodiments, configurations, components, and structure. It will be understood by one of general skill in the art that the various microisolation systems are described herein for illustrative purposes, and variations and combinations of the various microisolation systems, as well as components thereof, are contemplated and may be achieved without departing from the scope and spirit of the present disclosure.

Figure 3:
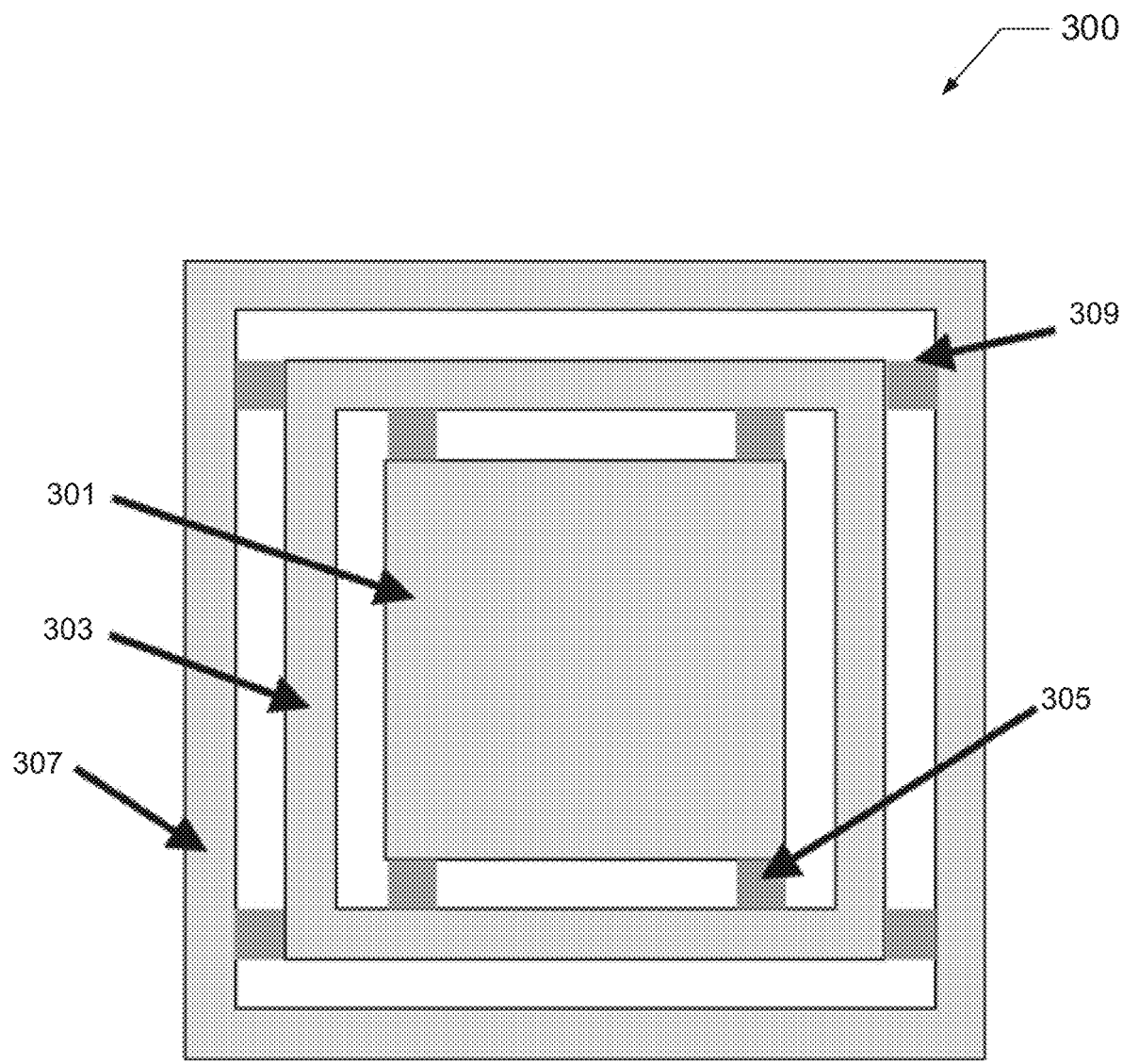
FIG. 3 is a top view of a microisolation system, according to one embodiment of the present disclosure.

With reference to FIG. 3, shown is a top view of a single-plane system 300 for microisolation, according to various embodiments of the present disclosure. In at least one embodiment, the single plane system 300 may include a microisolation assembly, an assembly for microisolation, a microisolation device, or an isolation damping device that includes one or more elements of the single plane system 300 (or other systems, assemblies, devices, etc. for microisolation or isolating damping) described herein. In various embodiments, the single-plane system 300 may demonstrate a 400 Hz cut-off frequency with over 500-microns of sway, a 10× attenuation in a stop band thereof, and a quality factor of less than 5. In at least one embodiment, the single-plane system 300 can include a central isolation platform 301. In one or more embodiments, the central isolation platform 301 can hold and support a sensor, such as, for example, a MEMS inertial sensor as described herein. In one or more embodiments the central isolation platform 301 may be connected to an intermediate platform 303. In at least one embodiment, a first set of interior springs 305 can connect the central isolation platform 301 to the intermediate platform 303. In various embodiments, the first set of interior springs 305 may isolate the central platform 301 from inertial forces by attenuating vibrations and frequencies within predetermined ranges. It will be understood by one of general skill in the art that the terms "connected," "attached," and "affixed" may be used interchangeably in the present disclosure.

In at least one embodiment, isolation performance of the first set of interior springs 305 may be determined by a spring constant that can be configured by selecting springs with a particular spring thickness. According to one embodiment, the single-plane system 300 (and other systems, assemblies, devices, etc. for microisolation described herein) may include springs 305 with spring constants measuring between about 50-150 nm on-axis displacement per 1 G on-axis acceleration, and measuring less than about 2.5 nm (for example, measuring about 0.0 nm) orthogonal displacement per 1 G on-axis acceleration. In one or more embodiments, a spring thickness of the first set of interior springs 305 may measure less than a thickness of the central isolation platform 301.

Figure 6:
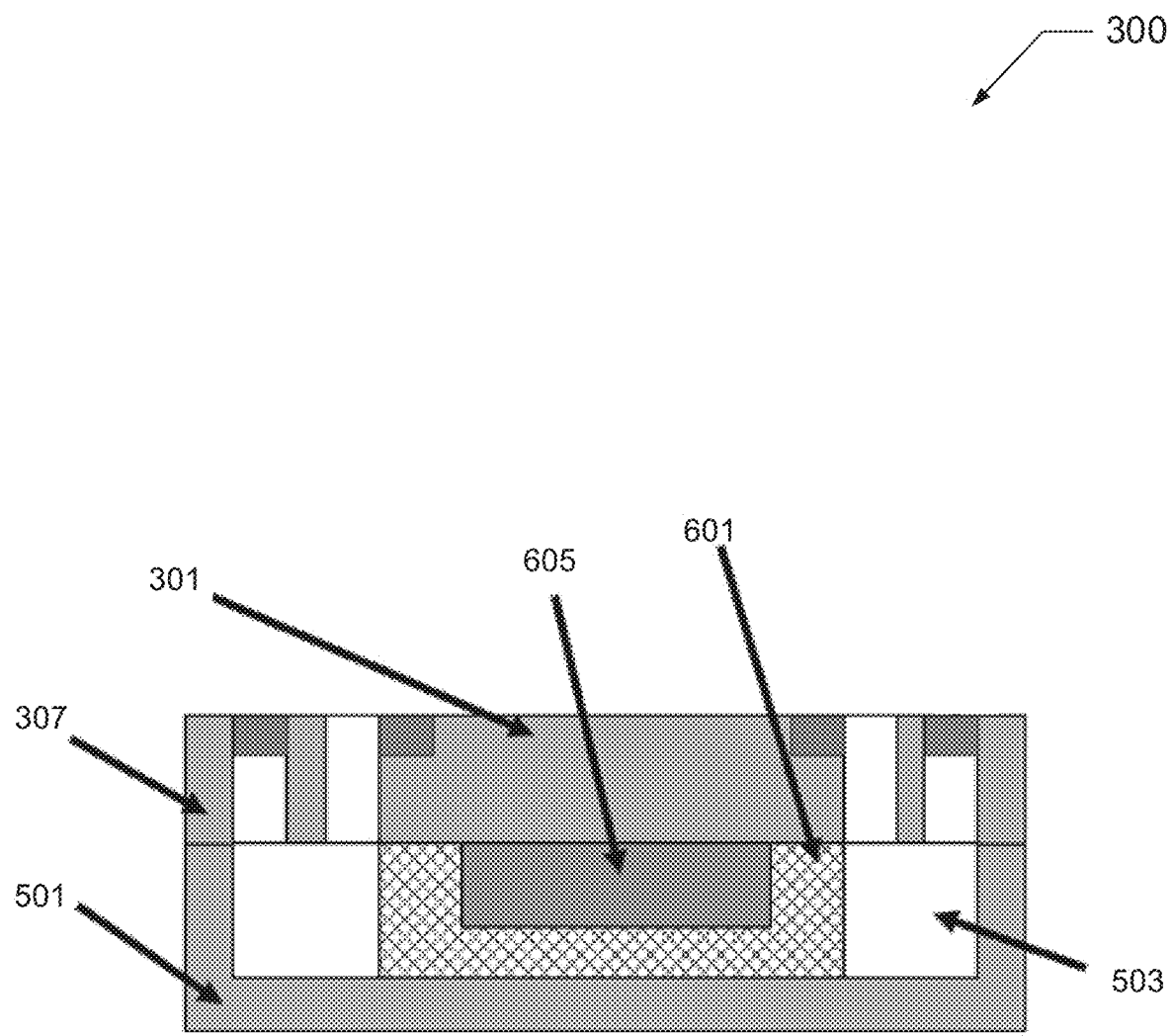
FIG. 6 is a side view of a microisolation system, according to one embodiment of the present disclosure.

In one or more embodiments, the intermediate platform 303 may surround and/or be coplanar with the central isolation platform 301. In various embodiments, the intermediate platform 303 may be connected to an outer platform 307 by a second set of interior springs 309. In at least one embodiment, the second set of interior springs 309 may isolate both the intermediate platform 303 and the central isolation platform 301 from inertial forces as described herein. In one or more embodiments, the single-plane system 300 may exclude the intermediate platform 303. For example, as shown in FIG. 6, an embodiment of the single-plane system 300 may include a central isolation platform 301 connected to an outer platform 301 by a first set of interior springs 303.

Figure 4:
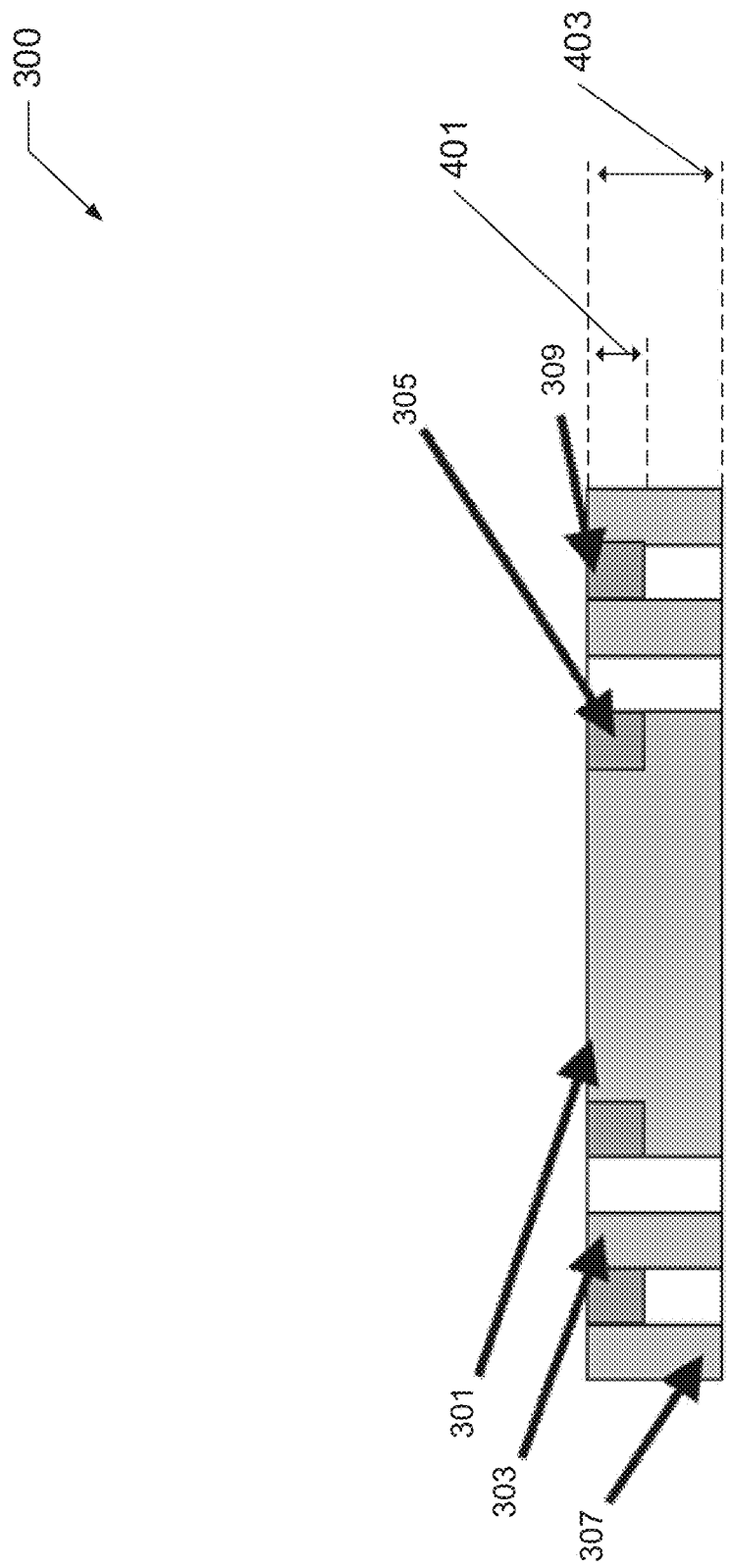
FIG. 4 is a side view of a microisolation system, according to one embodiment of the present disclosure.

With reference to FIG. 4, shown is a side view of the single-plane system 300, according to various embodiments of the present disclosure. In at least one embodiment, as described herein, the central isolation platform 301, intermediate platform 303, and outer platform 307 may be oriented in a single, shared plane. In various embodiments, the first and second sets of interior spring 305 and 309 may be partially non-coplanar with the central isolation platform 301, intermediate platform 303, and outer platform 307. In one or more embodiments, the non-coplanarity of the first and second sets of interior springs 305 and 309 may be caused by a difference between a spring thickness 401 and a platform thickness 403. In one or more embodiments the platform thickness 403

In at least one embodiment, the spring thickness 401 may measure less than the platform thickness 403. In one or more embodiments, spring thickness may determine a dynamic response of the single-plane system 300 (or other systems, devices, and assemblies described herein). For example, spring thickness may determine a dynamic response of the central isolation platform 301 in a vertical direction. In various embodiments, the spring thickness 401 may be selected to impart a particular spring constant onto the first and second set of interior springs 305 and 309. In one or more embodiments, the first set of interior springs 305 may present a spring thickness 403 that differs from a spring thickness 403 presented by the second set of interior springs 309. In at least one embodiment, differing spring thicknesses 403 may provide for differing spring constants that may allow the first and second sets of interior springs 305 and 309 to demonstrate differing isolation behavior.

For example, the first set of interior springs 305 may demonstrate a first spring thickness 403 and a first spring constant. In the same example, the second set of interior springs 309 may demonstrate a second spring thickness 403 measuring less than the first spring thickness 403, and may also demonstrate a second spring constant measuring less than the first spring constant. Continuing the same example, the second set of interior springs 309 may demonstrate a first stiffness, and may attenuate a primary range of inertial forces, while the first set of interior springs 305 may present a second stiffness measuring less than the first stiffness, and may attenuate a secondary range of inertial forces passed or incompletely attenuated by the second set of springs 309. In at least one embodiment, the spring thickness 403 and the platform thickness 405 may be substantially equal.

Figure 5:
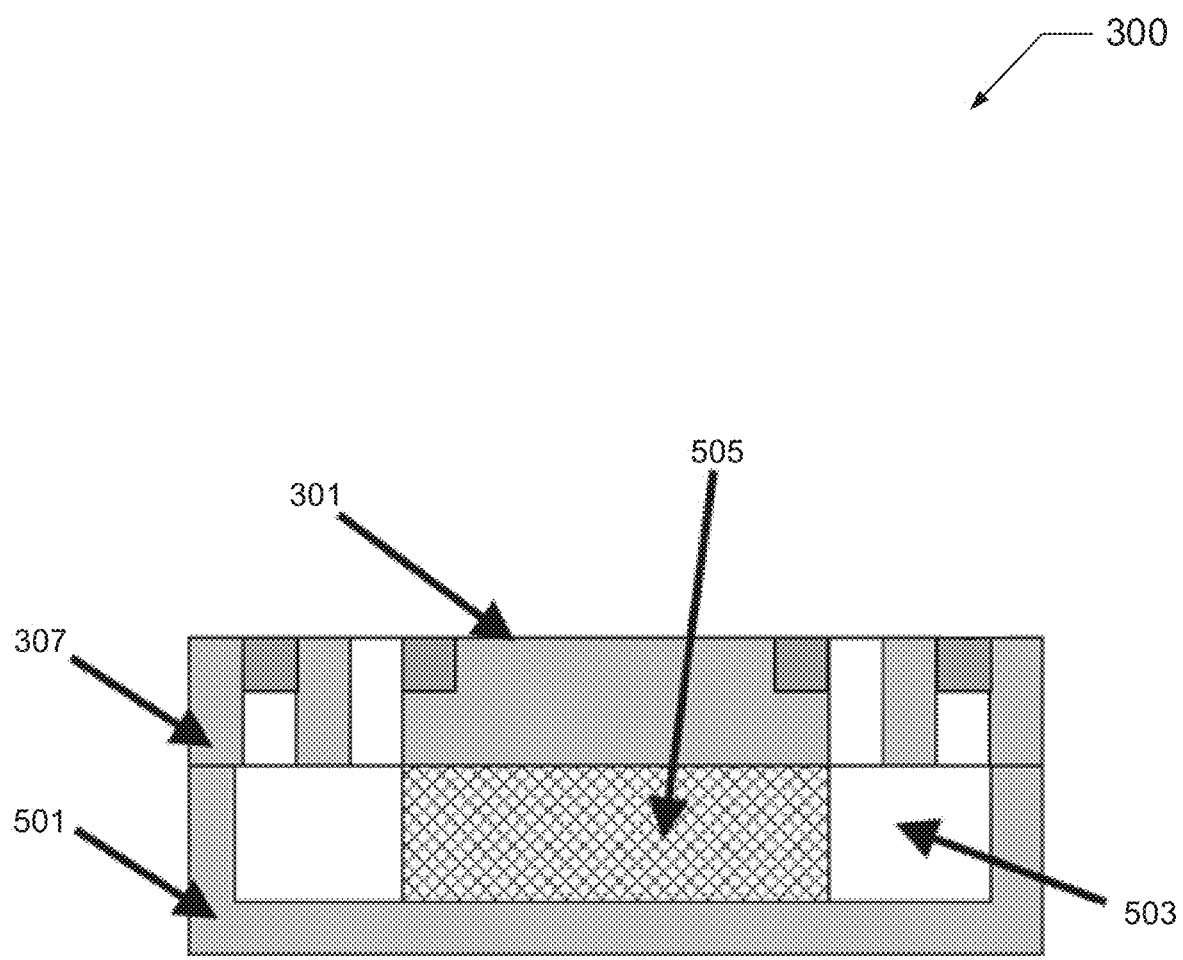
FIG. 5 is a side view of a microisolation system, according to one embodiment of the present disclosure.

With reference to FIG. 5, shown is a side view of the single-plane system 300, according to various embodiments of the present disclosure. In at least one embodiment the outer platform 307 may be connected to an outer frame 501 (e.g., that may also be referred to as a frame). For example, a bottom surface of the outer platform 307 may be bonded, or otherwise attached, to a top surface of the outer frame 501. In one or more embodiments, the outer frame 501 and/or the outer platform 307 may be substantially rigid and/or unyielding. In various embodiments, the outer frame 501 may include a cavity 501 that can include a mesh 505 (e.g., that may also be referred to as a mesh damper). In at least one embodiment, the mesh 505 may be bonded, soldered, or, otherwise, attached to a bottom surface of the central isolation platform 301 and/or a top surface of the outer frame 501. In one or more embodiments, the mesh 505 can compress and expand in response to shocks and vibrations, thereby isolating the central isolation platform 501 from the shocks and vibrations. In at least one embodiment, the cavity 501 can contain and/or restrict compression and other deformations and movements of the mesh 505.

In at least one embodiment, the mesh 505 may include one or more materials, and the one or more materials may be included in a microfibrous form, thereby forming a microfibrous mesh 505. For example, the mesh 505 may include microfibrous nickel metal materials formed into a microfibrous structure. In one or more embodiments, the mesh 505 may include metal materials that may advantageously lack off-gassing properties demonstrated by previously used damping solutions. Off-gassing properties can interfere with performance of MEMS-based sensors when off-gassed materials deposit onto structures and change critical electrical, mass, or structural properties. For example, the mesh 505 may include microfibrous nickel material that does not demonstrate off-gassing properties. In one or more embodiments, a polymer, cloth, or other material may be included in the cavity 501 (with or without the mesh 505), and may be attached to the central isolation platform 301 and the outer frame 501. In at least one embodiment, the mesh 505 may include a plurality of materials, including, for example, rigid intermediary materials to affect the performance of the single-plane system 300. In one or more embodiments, the mesh 505 may be vacuum compatible.

With reference to FIG. 6, shown is a side view of the single-plane system 300, according to various embodiments of the present disclosure. In one or more embodiments, the single-plane system 300 may include damper material 601 that can be disposed within cavity 503 of an outer frame 501. In one or more embodiments, the damper material 501 may partially and/or fully surround a second material 605 also disposed in the cavity 503. In at least one embodiment, the second material 605 may be a mesh 505, as described herein. In one example, a bottom surface the damper material 601 may be attached to a top surface of the outer frame 501, a first top surface of the damper material 601 may be attached to or otherwise support a second material 605, and a second top surface of the damper material 601 and a top surface of the second material 605 may be attached to a bottom surface of a central isolation platform 301. In at least one embodiment, the damping material 601 may be included to tune, calibrate, or otherwise alter isolation performance of the single-plane system 300. In one or more embodiments, the damping material 601 may be included in a proportion selected to induce a change in the shock response spectrum (SRS) and/or power spectral density (PSD) of the single-plane system 300. In various embodiments, a thickness of the damping material 601 may be selected to achieve a desired change in the SRS and/or PSD. For example, a thickness of the damping material 601 may be selected to reduce an amplitude of an SRS and/or PSD within a specific frequency range. In one example, a thickness of the damping material 601 may be increased to lower a response frequency of the single-plane system 300 (or of other systems, devices, assemblies, etc. described herein). In another example, response of the single-plane system 300 may be modified by selecting parameters of the damping material 601 including, but not limited to, magnitude of compression, material thickness, area, and density, among other parameters.

Figure 7:
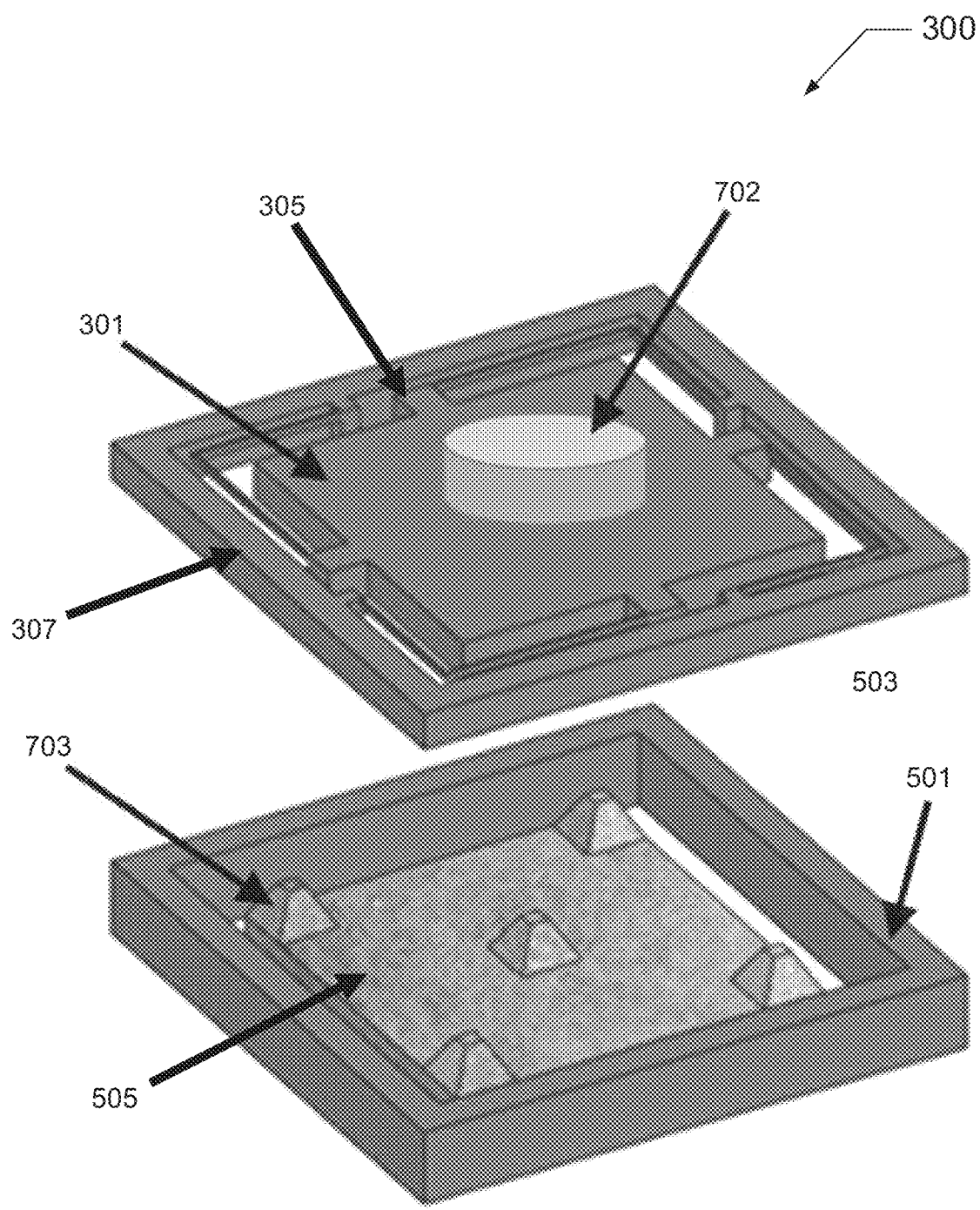
FIG. 7 is a perspective view of a microisolation system, according to one embodiment of the present disclosure.

With reference to FIG. 7, shown is a partially-exploded view of the single-plane system 300, according to various embodiments of the present disclosure. As described herein, in at least one embodiment, the single-plane system 300 may include a central isolation platform 301 connected to an outer platform 307 by one or more interior springs 305. In various embodiments, the central isolation platform 301 can hold and support a sensor 702. For example, a sensor 702 can be attached or mounted onto a top surface of the central isolation platform 301.

In various embodiments, the single-plane system 300 may include an outer frame 501 that may be connected to the outer platform 307. For example, a bottom surface of the outer platform 307 may be bonded, soldered, or otherwise attached to a top surface of the outer frame 501. In one or more embodiments, the outer frame 501 may include a cavity 501 that can contain a mesh 505 (as described herein). In various embodiments, the mesh 505 may be bonded, soldered, or otherwise attached to the central isolation platform 301, to the outer frame 501, and/or to other elements, such as, for example, a section of substrate material or an electronics package used to package die-level integrated circuits. In one example, a top surface of the mesh 505 may be attached to a bottom surface of the central isolation platform 301, and a bottom surface of the mesh 505 may be attached to a top surface of a section of substrate material. In at least one embodiment, the mesh 505 may be attached to only the central isolation platform 301. In one or more embodiments, the mesh 505 may be attached on a bottom surface (e.g., to an outer frame, substrate material, etc.), but may be unattached, on a top surface thereof, to a central isolation platform.

In at least one embodiment, the mesh 505 may be patterned and/or formed with compressed regions 703 that may form connection points between the mesh 505 and a bottom surface of the central isolation platform 301. For example, a mesh 505 may include compressed regions 703 that form pillars (retaining isolation properties of the mesh 505) located at each corner and a central point of a central isolation platform 301. In the same example, a bottom surface of the central isolation platform 701 may be attached to the mesh 505 at each of the compressed regions 703.

In one or more embodiments, the one or more interior springs 305 may be substantially L-shaped. For example, an interior spring 305 may include a first section integrally formed with a second section, and the first section may be oriented perpendicular the second section. In at least one embodiment, an interior spring 305 may provide a perpendicular connection and isolation structure between the central isolation platform 301 and the outer platform 307 (or, in some embodiments, an intermediate platform 303). For example, an interior spring 305 may be attached at a first end to a side of the central isolation platform 301. In the same example, the interior spring 305 may be attached at a second end (opposite the first end) to a side of the outer platform 307. Continuing the same example, the connected side of the central isolation platform 301 may be perpendicular to the connected side of the outer platform 307. In at least one embodiment, an interior spring 305 may be connected at a mid-point of a side of a central isolation platform 301, intermediate platform 303, and/or outer platform 307. For example, an interior spring 305 may be connected to a particular point on a side of a central isolation platform 301. In the same example, the particular point may be vertically and/or horizontally centered on the side of the central isolation platform 301. In at least one embodiment, an interior spring 305 may be connected at an off-center point of a side of a central isolation platform 301, an intermediate platform 303, and/or an outer platform 307.

In at least one embodiment, the one or more springs 305 and the mesh 505 may be configured to attenuate inertial forces measuring within one or more specific ranges. For example, a spring constant of the one or more springs 305 may be selected (e.g., via a spring thickness 401) such that vibrations and frequencies within a particular range are attenuated, but vibrations and frequencies outside of the particular range are passed to a connected central isolation platform 301 to be measured or otherwise experienced by a sensor 702 mounted thereon. As another example, a thickness of a mesh 505 may be selected such that shocks of magnitudes measuring above a particular threshold are attenuated or dispersed (e.g., via compression of the mesh 505), but shocks of magnitudes measuring below the particular threshold are passed to a connected central isolation platform 301. In one or more embodiments, a polymer, cloth, or other material may be included in the cavity 501 in addition to or in place of the mesh 505. In at least one embodiment, the single-plane system 300 may include an additional platform, substrate, or other section disposed between the mesh 505 (or polymer, cloth, etc.) and the central platform 301. For example, the single-plane system 300 may include a lower substrate disposed between a mesh 505 and a central isolation platform 301. In the same example, a bottom surface of the lower substrate may be attached to a top surface of the mesh 505, and a top surface of the lower substrate may be attached to a bottom surface of the central isolation platform 301. Continuing the same example, the lower substrate may further isolate the central isolation platform 301 from large shocks that may saturate (e.g., fully compress) the mesh 505.

Figure 8:
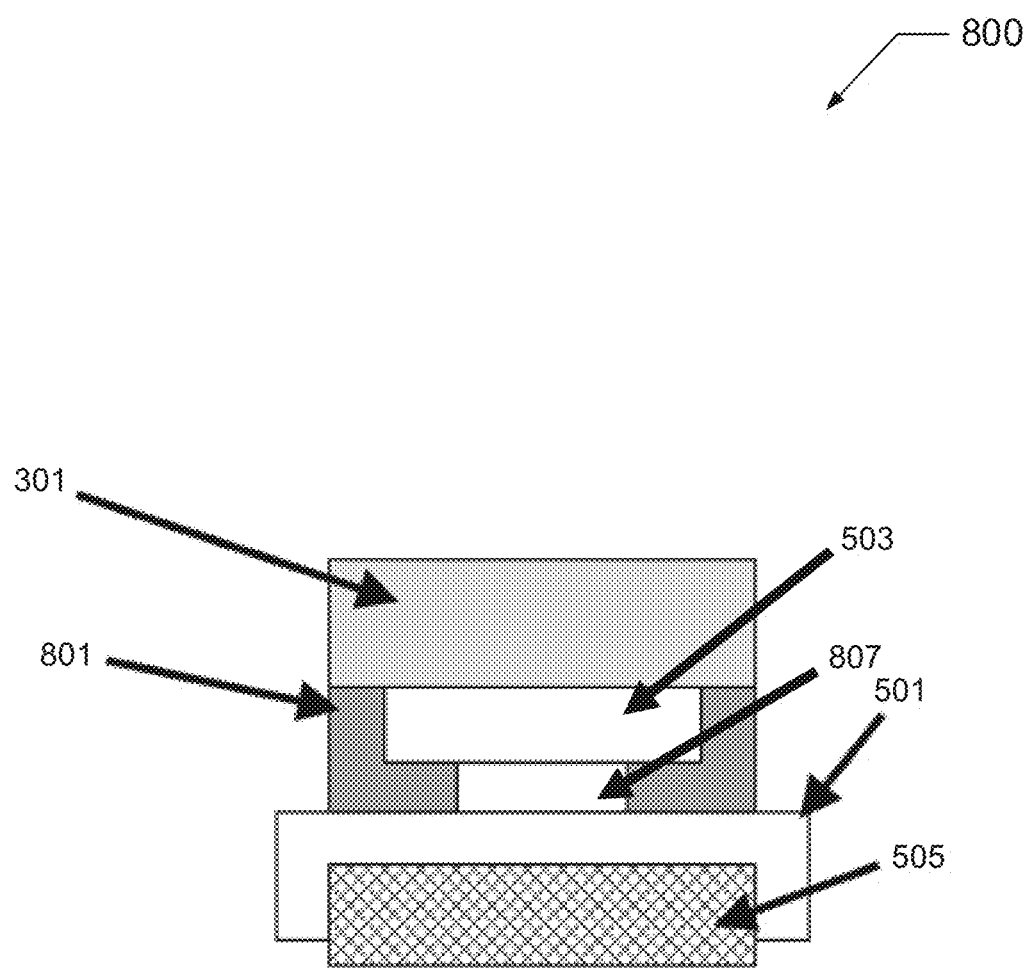
FIG. 8 is a side view of a microisolation system, according to one embodiment of the present disclosure.

With respect to FIG. 8, shown is a side view of a folded system 800 for microisolation, according to various embodiments of the present disclosure. In at least one embodiment, the folded system 800 may include a microisolation assembly, an assembly for microisolation, a microisolation device, or an isolation damping device that includes one or more elements of the folded system 800 (or other systems, assemblies, devices, etc. for microisolation or isolating damping) described herein. In various embodiments, the folded system 800 may demonstrate a 600 Hz cut-off frequency with over 400-microns of sway, a 10× attenuation in a stop band thereof, and a quality factor of less than 5. In at least one embodiment, the folded system 800 may include a central isolation platform 301 (FIG. 3) as described herein. In one or more embodiments, the platform 301 may be connected to an outer frame 501 via one or more folded springs 801. For example, a bottom surface of the platform 301 may be bonded, soldered, or otherwise attached to a top region of the one or more folded springs 801. In the same example, a top surface of the outer frame 501 may be bonded, soldered, or otherwise attached to a bottom region of the one or more folded springs 801. In various embodiments, a mesh 505 may be affixed to the outer frame 501. In at least one embodiment, the mesh 505 may also be affixed to a substrate, electronics package, or other element not illustrated in FIG. 8. For example, a top surface of the mesh 505 may be attached to a bottom surface of the outer frame 501, and a bottom surface of the mesh 505 may be attached to a substrate layer. In one or more embodiments, as shown in FIG. 6, an outer frame 501 may be inverted in a manner such that a connected mesh 505 is disposed between a (now) top surface of the outer frame 501 and a bottom surface of one or more folded springs 801 and/or a central anchor 807. In at least one embodiment, the above described inversion may be utilized in a folded system 800 to reduce a physical footprint thereof. In one or more embodiments, the inverted configuration may provide better isolation of cross-coupling by use of the folded springs 803, or other springs (e.g., such as a vertical spring). In various embodiments, the inverted configuration may advantageously reduce complexity of designing and producing springs that provide a desired directional response.

In one or more embodiments, the one or more folded springs 801 may present a perpendicular structure. For example, a folded spring 801 may include a vertical section integrally formed with (or otherwise connected to) a horizontal section, thereby presenting a substantially perpendicular spring structure. In various embodiments, the one or more folded springs 801 may include spring constants measuring between about 50-150 nm on-axis displacement per 1 G on-axis acceleration, and measuring less than about 2.5 nm (for example, measuring about 0.0 nm) orthogonal displacement per 1 G on-axis acceleration.

In at least one embodiment, the one or more folded springs 801 may advantageously isolate the central isolation platform 301 from inertial forces by attenuating vibrations and frequencies equally in X, Y, and Z directions. For example, a set of folded springs 801 may provide the central isolation platform 301 with 3-axis isolation by demonstrating spring constants and modal frequencies matched within 10% in all directions. In various embodiments the one or more folded springs 801 may be attached to a central anchor 807 that constrains spring motion. In one or more embodiments, spring constant and modal frequency matching may advantageously allow the folded system 800 to isolate shocks and vibrations from all directions equally, which may cause sensor performance to be agnostic to or unaffected by sensor installation orientation. In at least one embodiment, if multiple folded springs 801 are utilized, a subset of the folded springs 801 may be attached to the central anchor 807, and another subset of the folded springs 803 may be unattached thereto.

In at least one embodiment, the folded system 800 can include one or more cavities 503. In one or more embodiments, the one or more cavities 503 can include damping material or other materials that modify microisolation behavior of the folded system 800. For example, the one or more cavities 503 can include a damping material that modifies an isolation effect provided by the mesh 505.

Figure 9:
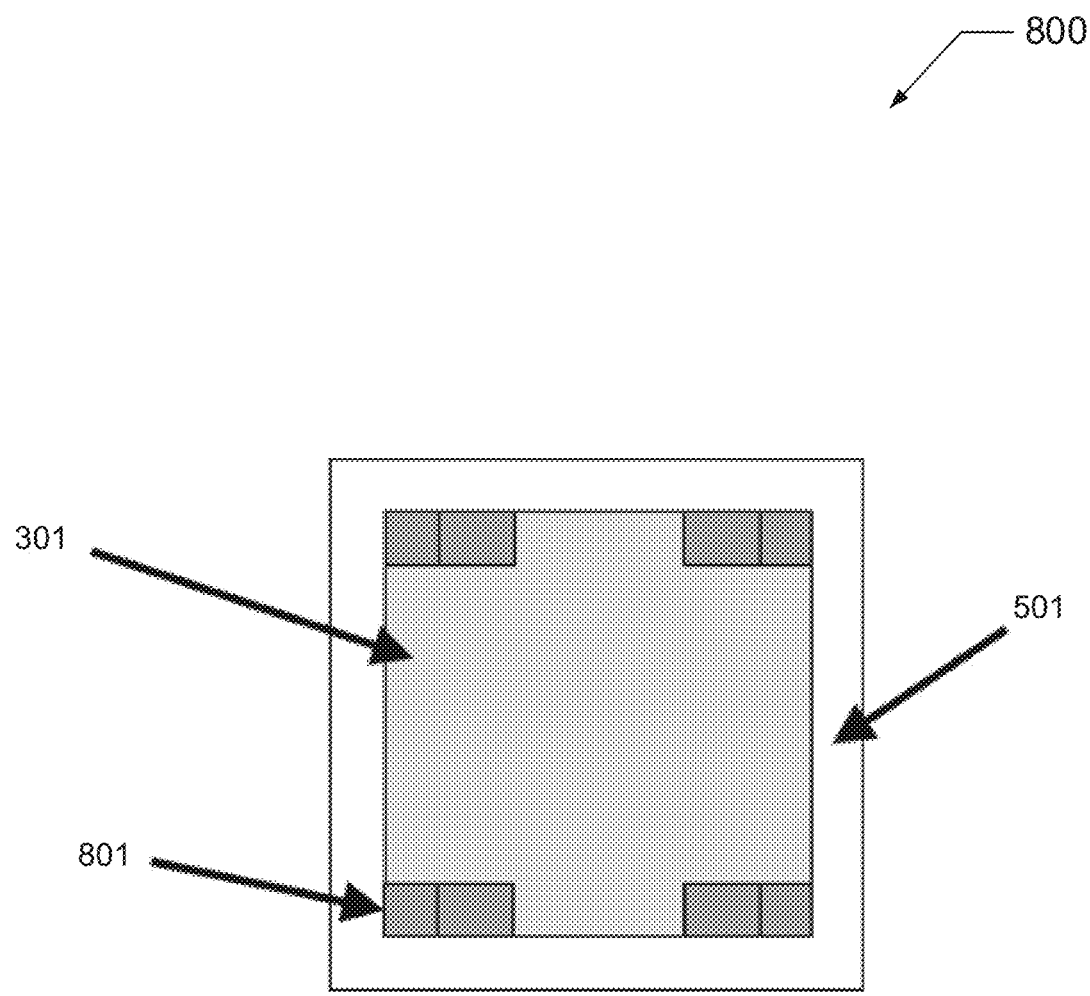
FIG. 9 is a top view of a microisolation system, according to one embodiment of the present disclosure.

With reference to FIG. 9, shown is a top view of a folded spring microisolation system 800, according to various embodiments of the present disclosure. In one or more embodiments, the folded spring system 800 can include a central isolation platform 301, as described herein. In FIG. 9, for descriptive and illustrative purposes, corners of the central isolation platform 301 may be excluded to permit view discussion of elements disposed underneath the central isolation platform 301. In at least one embodiment, one or more folded springs 801 may connect the central isolation platform to an outer frame 501. In one or more embodiments, the outer frame 501 may be substantially rigid and/or unyielding.

In one or more embodiments, one or more folded springs 801 may be positioned in a symmetrical pattern. For example, a folded spring 801 may be positioned at each corner of a central isolation platform 301. In the same example, each folded spring 801 may be oriented such that a horizontally-projecting section of the folded spring 801 is oriented at a right angle to a nearest corner of the central isolation platform 801. Continuing the same example, a horizontally-projecting section of a first folded spring 801 may be positioned in alignment with a horizontally-projecting section of a second folded spring 801 located immediately clockwise from the first folded spring 801. Alternatively, each horizontally-projecting section of each folded spring 801 may be oriented at positions perpendicular to one or more other horizontally-projecting sections.

In various embodiments, a cross-section of a top and/or bottom surface of the one or more folded springs 801 may include a circular, semi-circular, and/or polygon-based shape. For example, a top surface of the one or more folded springs 801 may present a substantially square-shaped cross-section. In at least one embodiment, a top surface and/or bottom surface of a folded spring 801 may be smooth and/or textured to improve attachment to other elements of the folded system 800 described herein.

Figure 10:
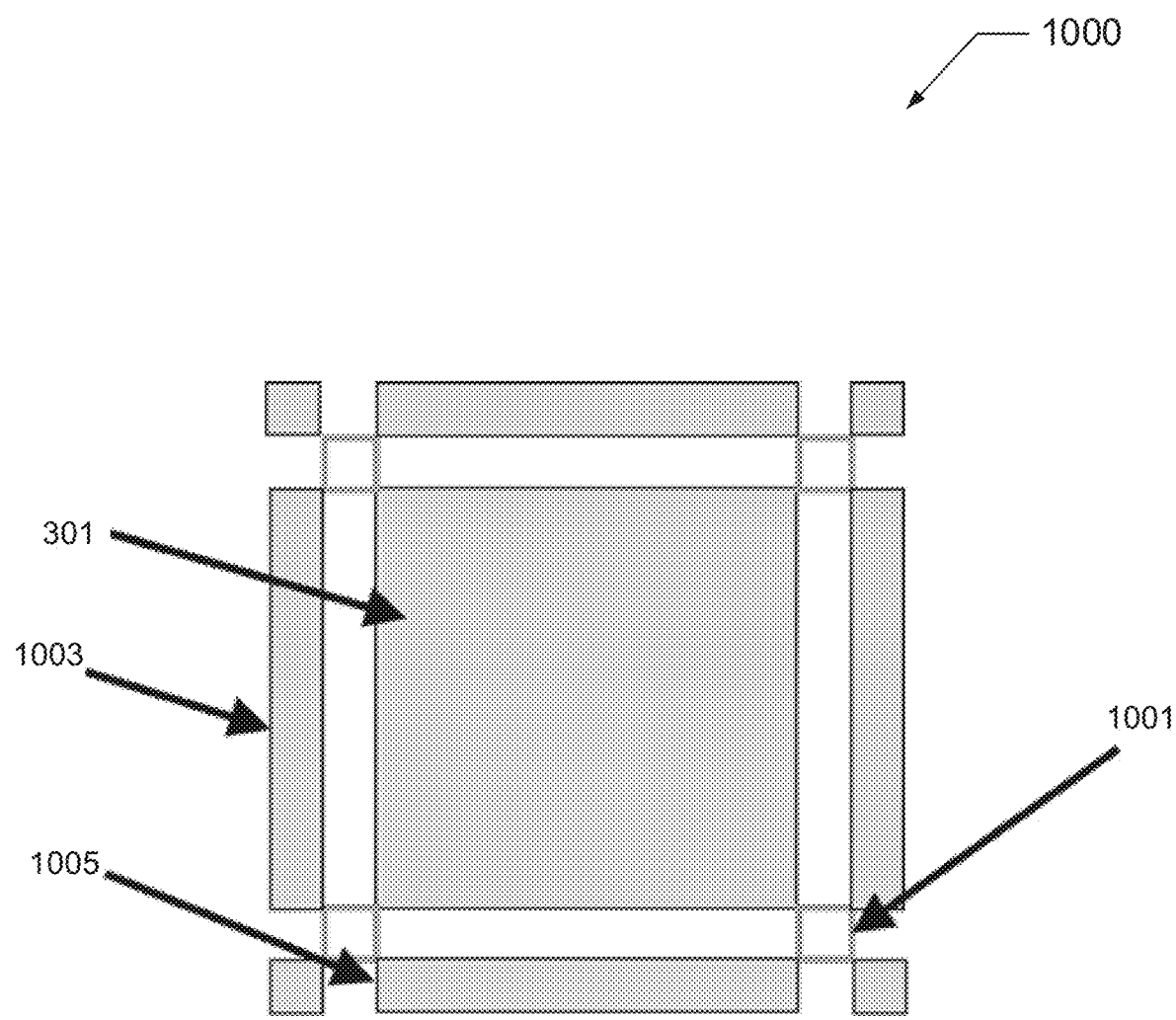
FIG. 10 is a top view of a microisolation system, according to one embodiment of the present disclosure.

With reference to FIG. 10, shown is a top view of a tri-fold symmetric microisolation system 1000, according to various embodiments of the present disclosure. In at least one embodiment, the tri-fold symmetric system 1000 may include a microisolation assembly, an assembly for microisolation, a microisolation device, or an isolation damping device that includes one or more elements of the tri-fold symmetric system 1000 (or other systems, assemblies, devices, etc. for microisolation or isolating damping) described herein. In one or more embodiments, the tri-fold symmetric system 1000 may be absent an outer frame 501 (FIG. 5). In at least one embodiment, the tri-fold symmetric system 100 may include a central isolation platform 301 that may be attached to one or more vertical anchors 1001. In one or more embodiments, the one or more vertical anchors 1001 may also be attached to a lower fixed body, such as, for example, a substrate, electronics package, or other body. For example, a top surface of a vertical anchor 1001 may be attached to a bottom and/or side surface of a central isolation platform 301. In the same example, a bottom surface of the vertical anchor 1001 may be attached to a top surface of a substrate section.

In various embodiments, the tri-fold symmetric system 1000 may include sliding structures 1003 and/or sliding structure 1005 that may be attached to the one or more vertical anchors 1001. In at least one embodiment, the sliding structures 1003 and/or sliding structure 1005 may couple and isolate horizontal and/or vertical motion of the tri-fold symmetric system 1000 away from the central isolation platform 301. For example, in response to a horizontal motion, one or more sliding structure 1003 and/or sliding structures 1005 may translate along the direction of the motion. In the same example, because the one or more sliding structures 1003 and/or sliding structures 1005 may be attached to one or more vertical anchors 1001 attached to a central isolation platform 301, the translation of the sliding structure 1003 and/or sliding structure 1005 may be isolated from the central isolation platform 301. In the same example, without the one or more sliding structures 1003 and/or sliding structures 1005, the horizontal motion may be passed directly to the central isolation platform 301; however, with the one or more sliding structures 1003 and/or sliding structures 1005, the horizontal motion may be isolated and compensated by corresponding translation of the one or more sliding structures 1003 and/or sliding structures 1005. As another example, a tri-fold symmetric system 1000 may experience a vertical motion, and one or more sliding structures 1003 and/or sliding structures 1005 may undergo corresponding vertical translation to compensate for the vertical motion and isolate a connected central isolation platform 301 from the vertical motion. In various embodiments, the one or more vertical anchors 1001 may allow the central isolation platform 301 to remain in a relatively fixed position, while one or more sliding structures 1003 and/or sliding structures 1005 undergo translations to isolate the central isolation platform 301 from vertical and horizontal motions.

Figure 11:
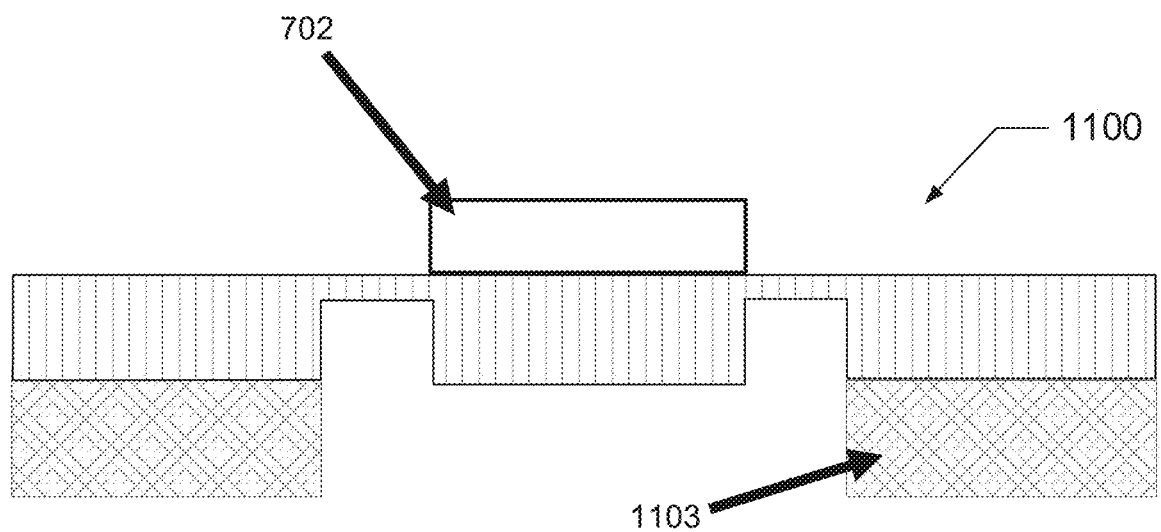
FIG. 11 is a side view of a microisolation system, according to one embodiment of the present disclosure.

With reference to FIG. 11, shown is a planar microisolation system 1100, according to one or more embodiments of the present disclosure. In at least one embodiment, the planar system 1100 may include a microisolation assembly, an assembly for microisolation, a microisolation device, or an isolation damping device that includes one or more elements of the planar system 1100 (or other systems, assemblies, devices, etc. for microisolation or isolating damping) described herein. In at least one embodiment, a sensor 702 may be attached to and/or mounted to the planar system 1100. In one or more embodiments the planar system 1100 may substantially similar to and/or include elements of other microisolation systems described herein, such as, for example, single-plane systems 300, folded system 800, tri-fold symmetric system 1000, and other microisolation systems. In various embodiments, the planar system 1100 may be attached to a microfibrous metal cloth (MFM) 1101 that acts as a damping mechanism and/or shock absorber (e.g., in a manner similar to a mesh 505 described herein) to provide additional isolation to the planar system 1100 and the sensor 702. In at least one embodiment, the planar system 1100 may be attached to more than one MFM 1101. For example, the planar system 1100 may include a left section and a right section that are each attached atop a MFM 1101. As another example, the planar system 1100 may be attached atop a single MFM 1101 that spans a length of an underside of the planar system 1100.

Figure 12:
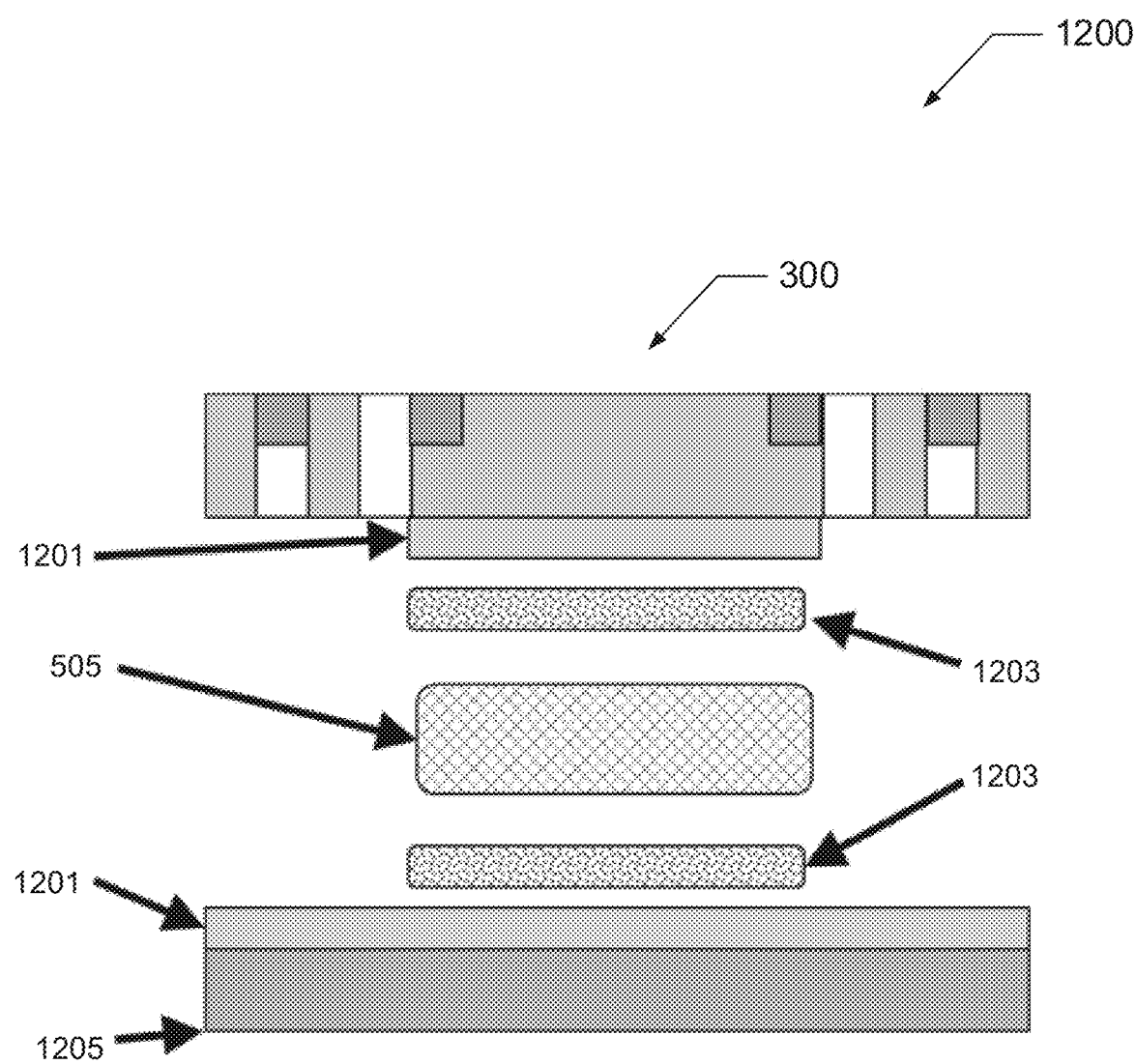
FIG. 12 illustrates an exemplary attachment process, according to one embodiment of the present disclosure.

With reference to FIG. 12, shown is an exemplary attachment process 1200 for attaching a mesh 505 to a single-plane system 300. In at least one embodiment, one or more elements of the attachment process 1200 may be used for attachment of a mesh 505 to one or more systems, assemblies, devices, etc. for microisolation and/or isolation damping described herein. In one or more embodiments, the attachment process 1200 may include applying an adhesion promoter 1201 to a bottom surface of the single-plane system 300 and/or to a top surface of a rigid substrate 1205. In at least one embodiment, the adhesion promoter 1201 may improve adhesion between the single-plane system 300 and/or rigid substrate 1205 and bonding material 1203. For example, a single-plane system 300 and a rigid substrate 1205 may be coated with the adhesion promoter 1201, and the adhesion promoter 1201 may improve adhesion between bonding material 1203 and silicon materials of the single-plane system 300 and the rigid substrate 1205.

In at least one embodiment, the bonding material 1203 may bond a mesh 505 to the single-plane system 300 and/or the rigid substrate 1205. For example, a bottom surface of a single-plane system 300 and a top surface of a rigid substrate 1205 may be coated with an adhesion promoter 1201. In the same example, a bonding material 1203 may be applied and bond to the bottom surface of a single-plane system 300 and the top surface of a rigid substrate 1205, and bonding may be improved (e.g., strengthened, accelerated, etc.) by the adhesion promoter 1201. Continuing the same example, a top surface of a mesh 505 may be bonded to the bonding material 1203 that is bonded to the bottom surface of the single-plane system 300, and a bottom surface of the mesh 505 may be bonded to the bonding material 1203 that is bonded to the top surface of the rigid substrate 1205.

In at least one embodiment, the attachment process 1200 may alternatively or additionally include: 1) coating surfaces of the single-plane system 300 and/or the rigid substrate 1205 (to be bonded to the mesh 505) with a thin layer of metal via electrodeposition; 2) dispensing soldering paste onto the surfaces of the single-plane system 300 and/or the rigid substrate 1205; 3) compressing the mesh 505 between the single-plane system 300 and the rigid substrate 1205; and 4) exposing the partially bonded single-plane system 300, mesh 505, and rigid substrate 1205 to a heating profile (e.g., in a solder-reflow oven) to complete bonding processes.

Figure 13A:
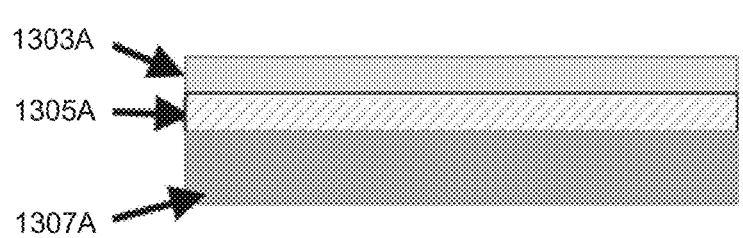
FIGS. 13A-D illustrate an exemplary fabrication process, according to one embodiment of the present disclosure.

With reference to FIG. 13A, shown is a fabrication process 1300 for fabricating one or more microisolation systems described herein. In at least one embodiment, one or more elements of the fabrication process 1300 may be used for fabrication of one or more systems, assemblies, devices, etc. for microisolation and/or isolation damping described herein. In one or more embodiments, the process 1300 may initiate with a silicon-on-insulator (SOI) wafer 1301A. In various embodiments, the SOI wafer 1301A may include, but is not limited to, a device layer 1303A, a buried oxide "box" layer 1305A, and a handle layer 1307A. In at least one embodiment, the box layer 1305A may act as an etch stop when material is removed from the device layer 1303A and/or handle layer 1307A. In one or more embodiments, thickness of the device layer 1303A and/or other layers may be precisely controlled.

Figure 13B:
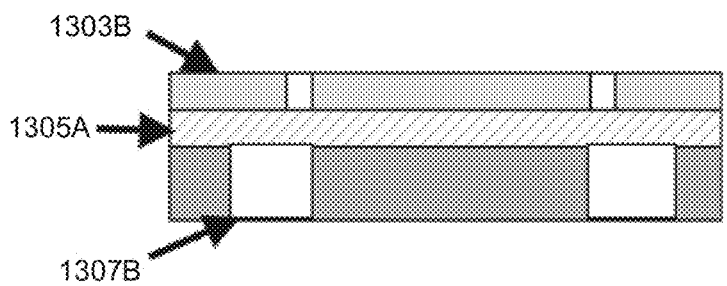

With reference to FIG. 13B, shown is the fabrication process 1300. In one or more embodiments, the fabrication process 1300 may include patterning the device layer 1303A and the handle layer 1305A via one or more microfabrication techniques to produce a SOI wafer 1301B including patterned device layer 1303B and patterned handle layer 1307B. In various embodiments, the one or more microfabrication techniques may include, but are not limited to, one or more of photolithography etching, plasma etching, wet etching, laser micromachining, and other methods that may selectively remove material from the device layer 1303A and the handle layer 1305A. In at least one embodiment, microfabrication of the SOI wafer 1301B may avoid removing excess silicon material from the box layer 1305A.

Figure 13C:
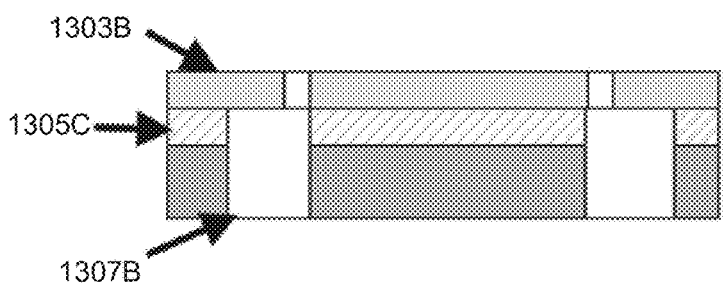

With reference to FIG. 13C, shown is the fabrication process 1300. In various embodiments, the fabrication process 1300 may include removing material to produce a SOI wafer 1301C. In at least one embodiment, material may be removed from the box layer 1305A to produce a box layer 1305C. In various embodiments, material may be moved via one or more methods including, but not limited to, wet etching, dry etching, plasma etching, and other material removal methods. In one or more embodiments, the patterned device layer 1303B and/or the patterned handle layer 1307B may function as windows for material removal processes.

Figure 13D:
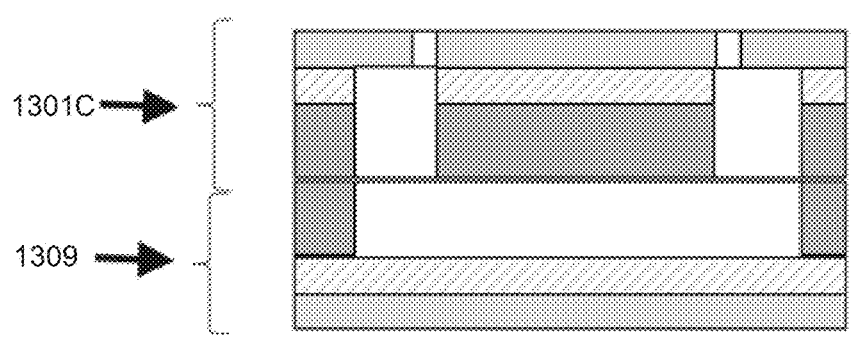

With reference to FIG. 13D, shown is the fabrication process 1300. In at least one embodiment, the fabrication process 1300 may include bonding the SOI wafer 1301C to one or more substrate structures 1309 to produce a microisolation system 1311. For example, to produce the microisolation system 1311, a bottom surface of a handle layer 1307B may be attached (e.g., bonded, mounted, etc.) to a top surface of one or more substrate structures 1309. In one or more embodiments, the one or more substrate structures may include, but are not limited to, one or more of rigid frames, springs (e.g., folded springs, vertical springs, horizontal springs, interior springs, etc.), and other substrate elements.

Figure 14:
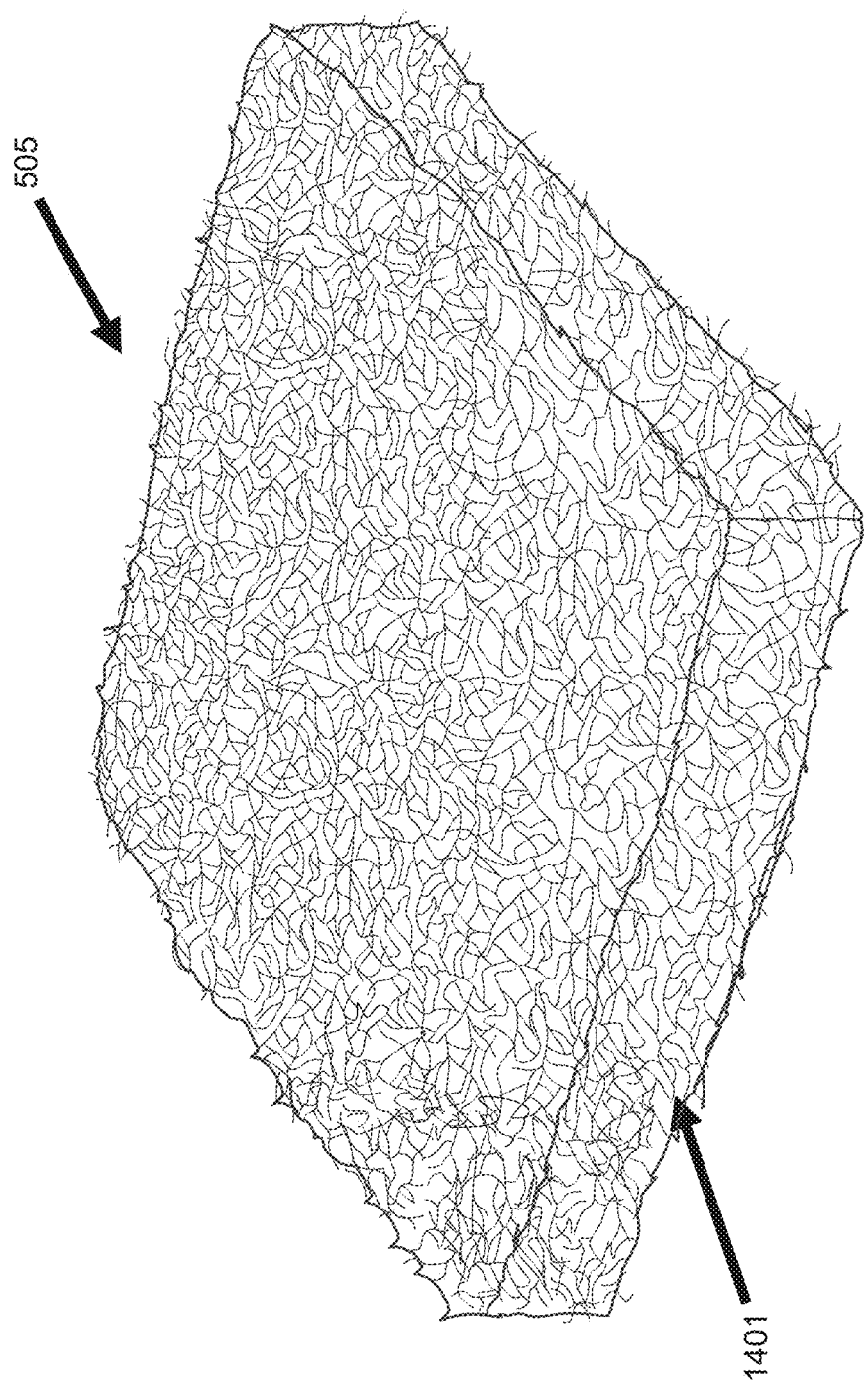
FIG. 14 is a perspective view of an exemplary mesh, according to one embodiment of the present disclosure.

With reference to FIG. 14, shown is a perspective view of a mesh 505, according to various embodiments of the present disclosure. In one or more embodiments, the mesh 505 may be bonded to a substrate. In at least one embodiment, the substrate may be substantially similar to other substrate-including structures described herein, including, but not limited to, outer frames 501, outer platforms 307, rigid substrate 1205, and other structures. According to one embodiment, the mesh 505 may be bonded to an electronics package, or the like. In various embodiments, the mesh 505 may be formed by microfibers 1403 interwoven to form a shape. For example, the mesh 505 may be formed by microfibers 1403 interwoven to form a rectangular prism of dimensions suitable for deployment into one or more microisolation systems described herein (e.g., in particular, into cavities 503 thereof). In at least one embodiment, the mesh 505 may include shapes including, but not limited to, rectangular prismatic shapes, pyramidal shapes, spherical shapes, ovoid shapes, and solids of revolution.

In one or more embodiments, a magnitude of microfibers 1403 used to form the mesh 505 may be selected to produce a predetermined microfiber density. In least one embodiment, the predetermined microfiber density may be based on desired isolation performance parameters. For example, a desired isolation performance parameter may necessitate an increased compressive resistance in a mesh 505. In the same example, a density of interwoven microfibers 1403 may be increased (e.g., relative to a baseline density) to increase compressive resistance of the mesh 505. In another example, the density may be decreased to decrease compressive resistance of the mesh 505. In at least one embodiment, the microfibers 1403 may be selectively interwoven to form regions of varying isolation performance. For example, microfibers 1403 may be interwoven to demonstrate greater resistance to horizontal shocks and inertial motions. In one or more embodiments, the microfibers 1403 may be interwoven to achieve a consistent and equally distributed isolation performance in a resultant mesh 505.

Figure 15:
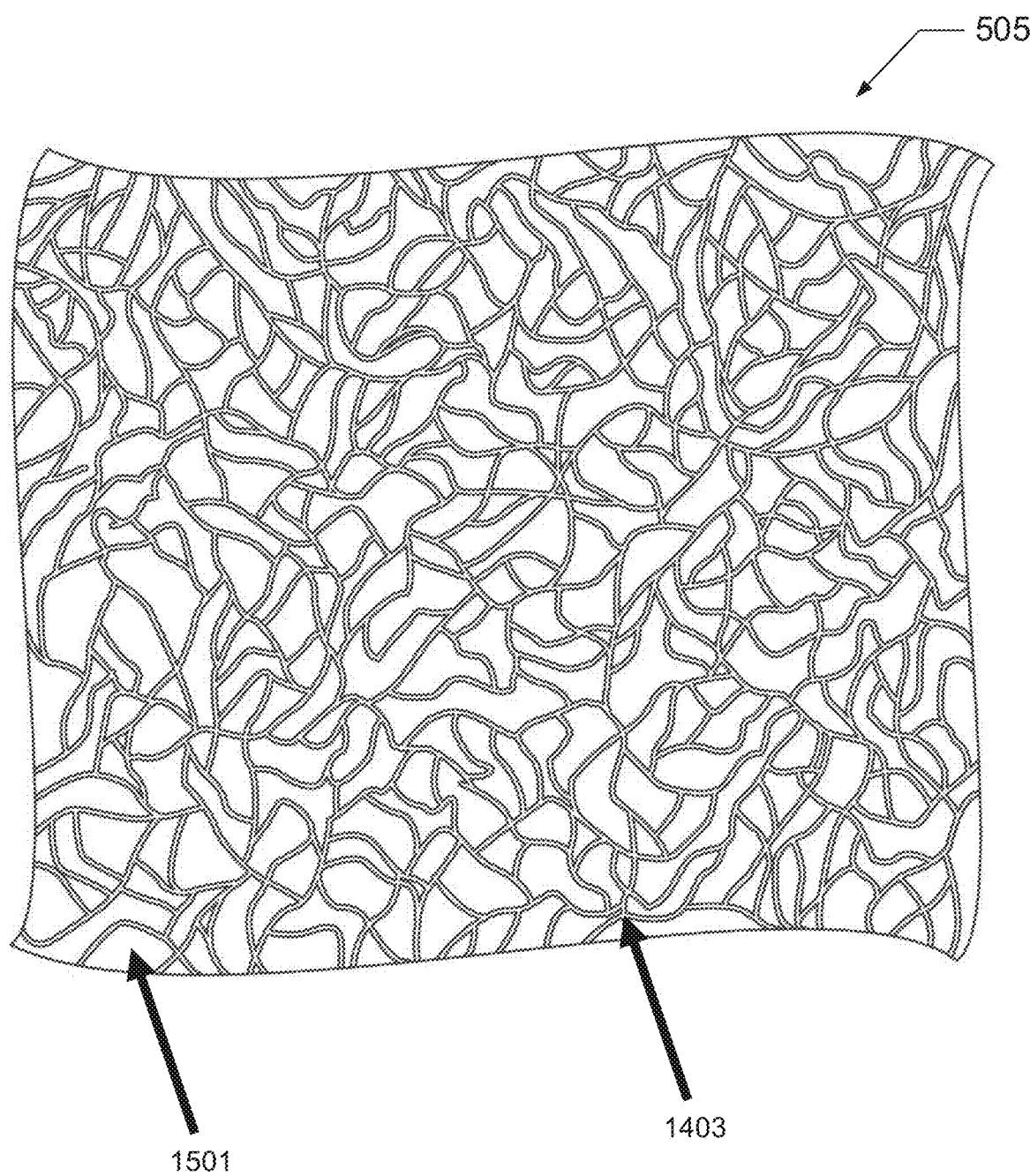
FIG. 15 illustrates a magnified sectional view of a mesh, according to one embodiment of the present disclosure.

With reference to FIG. 15, shown is a magnified partial view of a mesh 505, according to various embodiments of the present disclosure. In at least one embodiment, FIG. 15. may show the mesh 505 at a 100× level of magnification.

As described herein, the mesh 505 may include microfibers 1403 that may be interwoven to form the mesh 505 structure. In one or more embodiments, the mesh 505 may include voids 1501 located between the microfibers 1403. In one or more embodiments density of the microfibers 1403 may determine a magnitude of voids 1501 included in the mesh 505. In at least one embodiment, a ratio of the voids 1501 to the microfibers 1403 may determine a compressive and/or translational resistance and, thus, isolation performance of the mesh 505. For example, a mesh 505 that includes 25% voids 1501 and 75% microfibers 1403 may demonstrate a compressive resistance and a translational resistance measuring greater than a compressive resistance and a translation resistance of a mesh 505 that includes 45% voids 1501 and 55% microfibers 1403.

Figure 16:
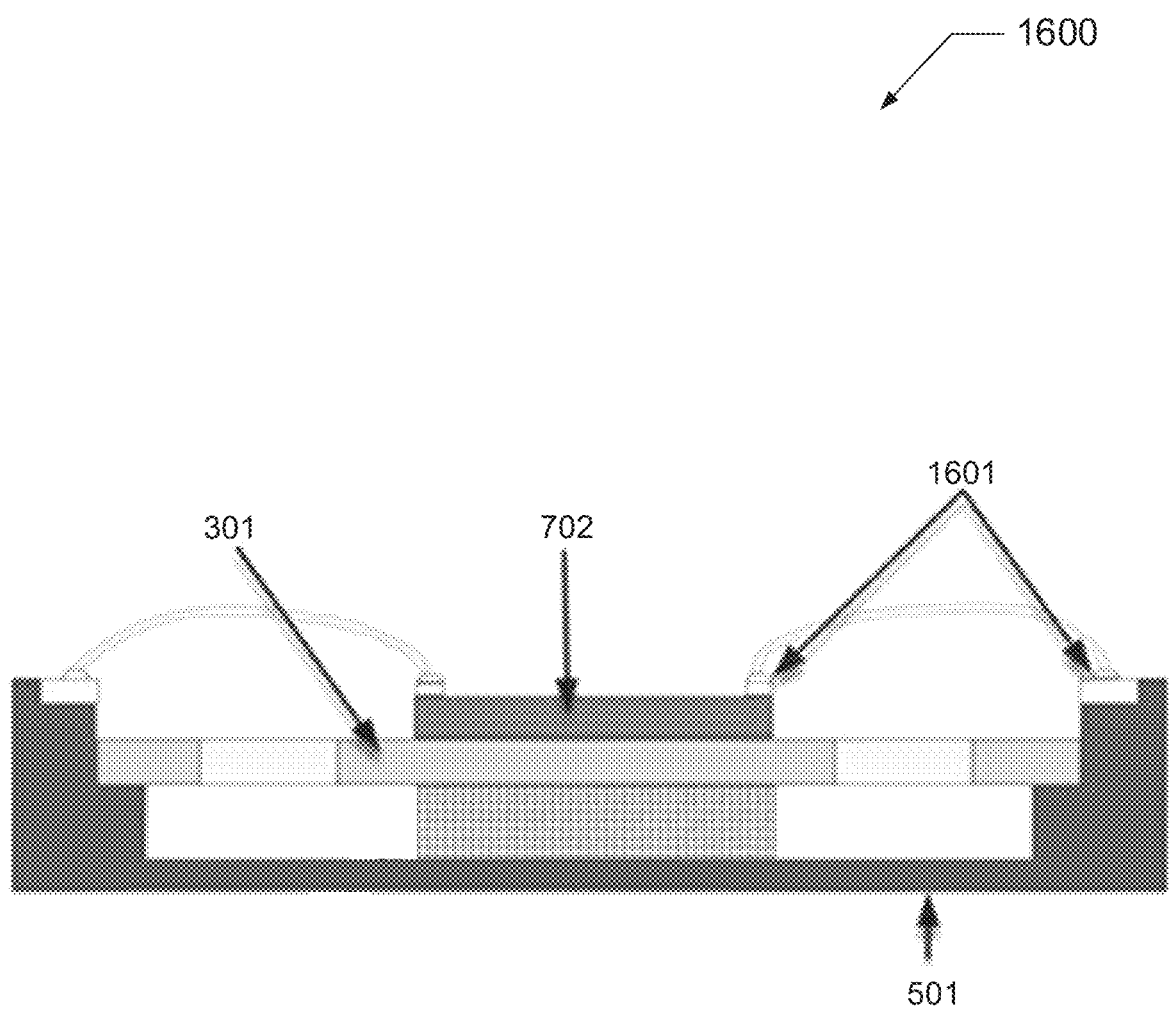
FIG. 16 is a side view of a microisolation system, according to one embodiment of the present disclosure.

With reference to FIG. 16, shown is a microisolation system 1600. In at least one embodiment, the microisolation system 1600 may include one or more wire bonds 1601 that connect a central isolation platform 301 and/or one or more sensors 702 to an outer frame 501, outer platform 307, and/or outer substrates. In one or more embodiments, a wire bond 1601 may include a conductive wire appropriately sized to span a connecting length between a first connection point 1603 and a second connecting point 1605. In various embodiments, to form connections, the wire bond 1601 may be bonded to a first connecting point 1603 that includes a conductive pad located on a central isolation platform 301. In one or more embodiments, to complete connections, the wire bond 1601 may be bonded to second connecting point 1605 that may include a conductive pad located on an outer frame 501, outer platform 307, and/or outer substrates. In at least one embodiment, the wire bond 1601 may conduct electrical signals and/or electrical power between a sensor 1602 and an outer frame 501, outer platform 307, and/or outer substrate. For example, a wire bond 1601 may conduct electrical signals between a sensor 1602 and a substrate. In the same example, the substrate can further conduct electrical signals to an external electronics package for further use by elements therein.

Figure 17:
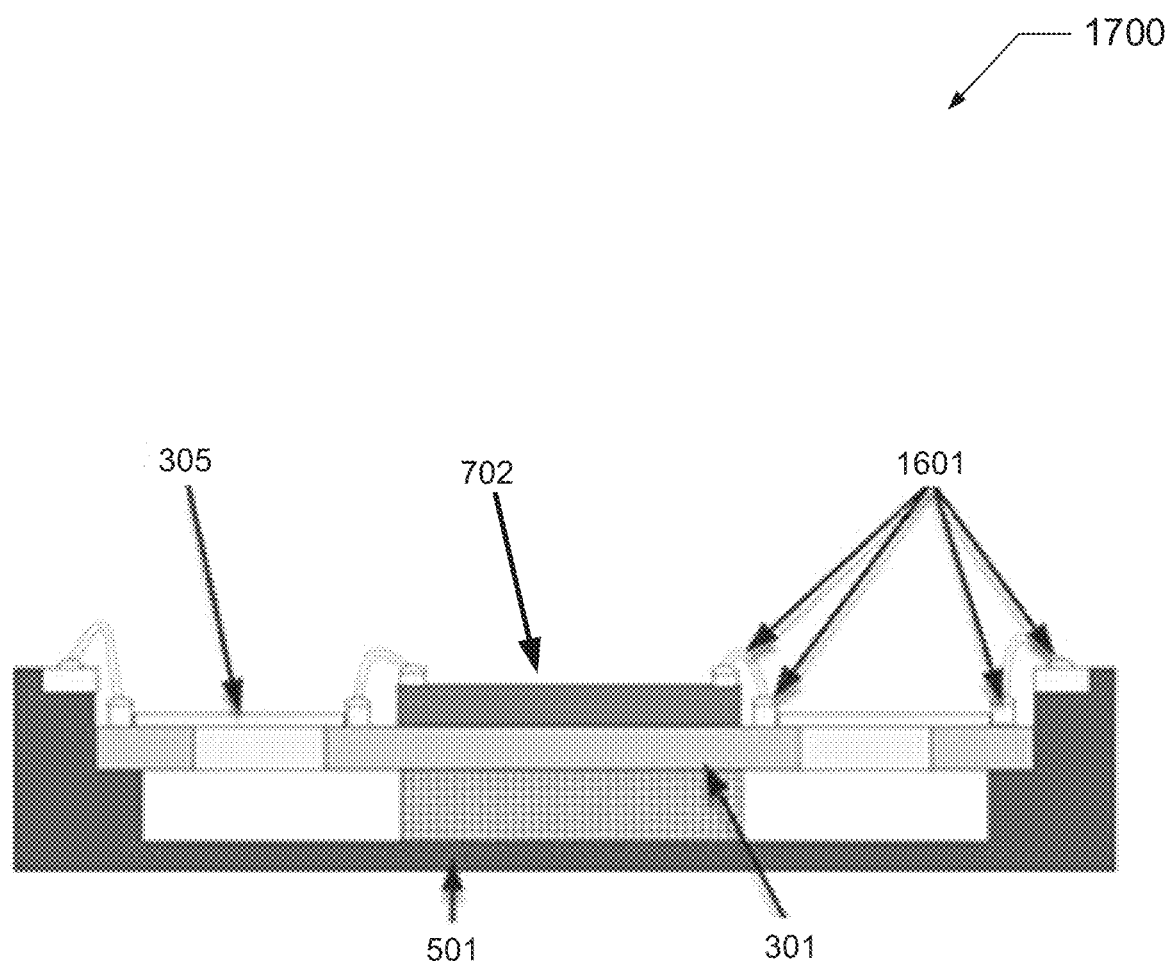
FIG. 17 is a side view of a microisolation system, according to one embodiment of the present disclosure.

With reference to FIG. 17, shown is a microisolation system 1700. In at least one embodiment, the microisolation system 1600 may include one or more wire bonds 1601 that connect a central isolation platform 301 and/or one or more sensors 702 to an outer frame 501, outer platform 307, and/or outer substrates via connections to interior springs 305. In various embodiments, a connection between a sensor 702 and an outer element may be provided by a first wire bond 1601 that connects the sensor 702 to an interior spring 305, and by a second wire bond 1601 that connects the interior spring 305 to the outer element (e.g., such as an outer frame 501). Accordingly, in one or more embodiments, an interior spring 305 (or any other spring described herein) may conduct electrical signals and/or power. As will be understood by one having ordinary skill in the art, the steps and processes shown in FIG. 3 (and those of all other flowcharts and sequence diagrams shown and described herein) may operate concurrently and continuously, are generally asynchronous and independent, and are not necessarily performed in the order shown.

Figure 18:
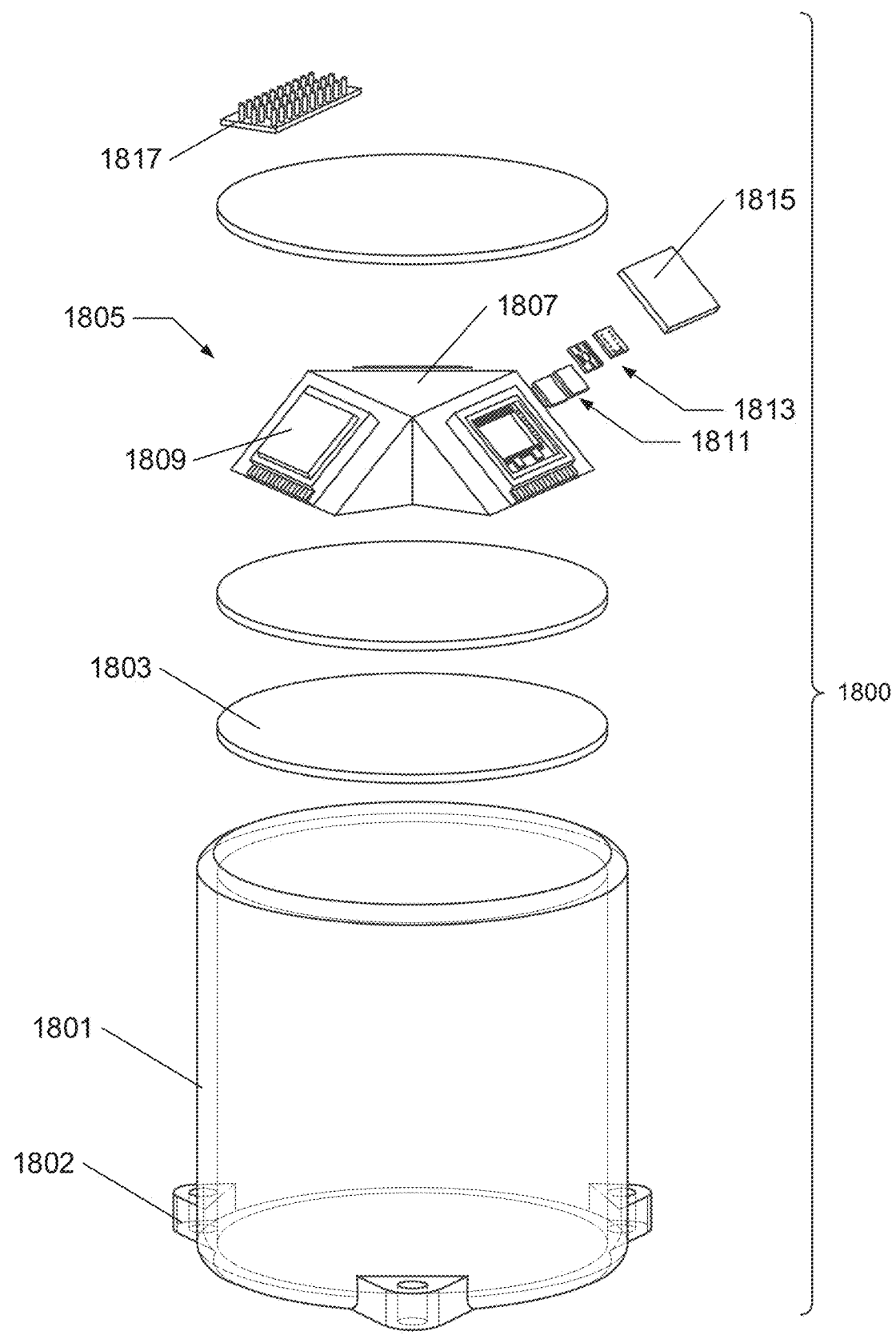
FIG. 18 is an exploded view of an inertial measurement unit (IMU), according to one embodiment of the present disclosure.

With reference to FIG. 18, shown is an exploded view of an inertial measurement unit (IMU) 1800, according to various embodiments of the present disclosure. In various embodiments, the IMU 1800 may include, but is not limited to, an IMU housing 1801, one or more spacers 1803, one or more alignment structures 1805, and one or more electrical connections 1817. In one or more embodiments, the IMU housing 1801 may receive and contain the components of the IMU 1800. In at least one embodiment, the IMU housing 1801 may partially isolate components therein from external environment factors including, but not limited to, temperature, moisture, and vibration. In one or more embodiments, the IMU housing 1801 may include structures 1802 for mounting or attaching the IMU 1800 to another structure, such as, for example, an IMU receipt for mounting IMUs 1800 to a device. In at least one embodiment, the IMUI housing 1801 may include transparent materials, for example, as shown in FIG. 18, that allow for inspection of components contained therein. In one or more embodiments, the IMU housing 1801 may include partially or fully opaque materials. In various embodiments, the one or more electrical connections 1817 may provide for electrical signal and power transmission between components housed within the IMU 1800 and one or more external systems and/or devices.

In at least one embodiment, an alignment structure 1805 may be a rigid structure for receiving packaged microisolation systems and sensors. In one or more embodiments, the alignment structure 1805 may precisely configure inertial sensors in an array to improve sensor accuracy. In various embodiments, the alignment structure 1805 may receive and align one or more electronics packages 1807. For example, an alignment structure 1805 may receive and align between about 1-5 electronics packages 1807.

In one or more embodiments, each electronics package 1807 may include, but is not limited to, one or more microisolation systems 1811, one or more sensors 1813, and a lid 1815. In at least one embodiment, the one or more sensors 1813 may attached to the one or more microisolation systems 1811. In various embodiments, the one or more microisolation systems 1811 may be any microisolation system described herein, such as, for example, single-plane systems 300, folded systems 800, and tri-folded symmetric systems 1000, among others. In one or more embodiments, the one or more sensors 1813 may be any sensor described herein, such as, for example, MEMS-based inertial sensors. In at least one embodiment, the one or more microisolation systems 1811 may be attached to an interior surface of the electronic package 1807. In one or more embodiments, embodiments, each of the one or more electrical packages 1807 may include conductive wires, connections, or other structures that may transmit electric signals and power between the electrical package 1807 and the one or more electrical connections 1817.

In at least one embodiment, the one or more spacers 1803 may include elements for spacing, distributing, and organizing components within the IMU 1800. In one or more embodiments, the one or more spacers 1803 may refer to other electronic components and circuit boards within the IMU 1800.

Figure 19:
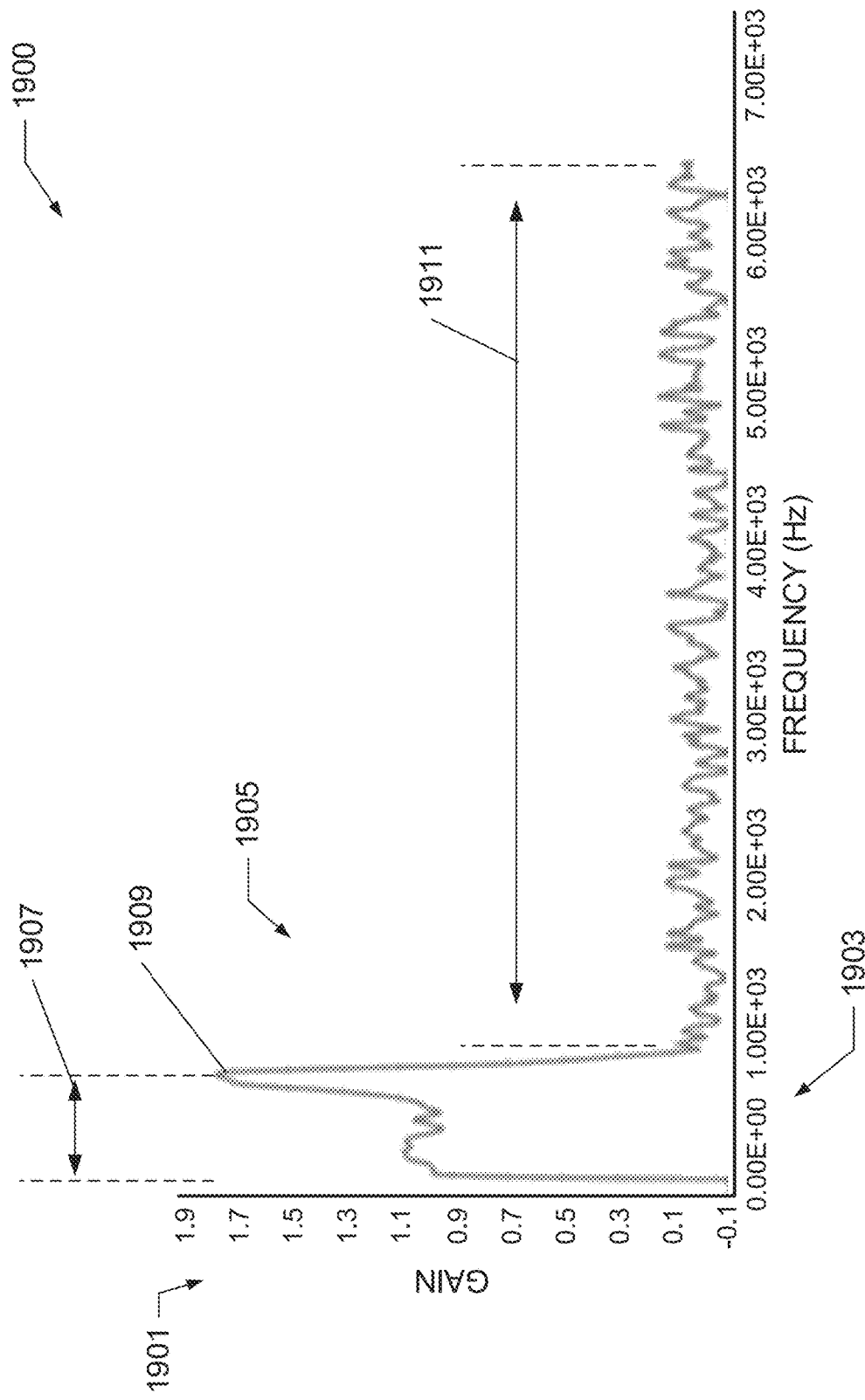
FIG. 19 is a chart illustrating a frequency response of a microisolation system, according to one embodiment of the present disclosure.

With reference to FIG. 19, shown is a chart 1900 relating signal gain 1901 to frequency 1903 as demonstrated by an exemplary microisolation system as described herein, such as, for example, a microisolation system including a mesh 505 (FIG. 5). In one or more embodiments, the chart 1900 includes a response curve 1905 that traces a relationship between signal gain 1901 and frequency 1903. In at least one embodiment, the frequency 1903 may refer to vibrational or other motion-based frequencies experienced by the microisolation system. In various embodiments, the gain 1901 describes an effect of the microisolation system on a signal demonstrating the frequency 1903.

In one or more embodiments, the response curve 1905 may include a passband 1907. In at least one embodiment, the passband 1907 refers to a range of frequencies 1903 that are passed (e.g., not significantly attenuated) by the microisolation system. In at least one embodiment, frequency 1903 passage may be characterized by a corresponding signal gain 1901 measuring greater than or equal to 1.0. In one or more embodiments, the frequencies 1903 present in the passband 1907 may represent signals that one or more sensors, attached to the microisolation system, are designed or configured to measure. In at least one embodiment, the passband 1907 may include frequencies 1903 measuring between about 0-1000 Hz.

In one or more embodiments, the response curve 1905 may include a peak 1909. In at least one embodiment, the peak 1909 may be representative of a lower natural frequency peak.

In various embodiments, the response curve 1905 may include a stop band 1911. In at least one embodiment, the stop band 1911 refers to a range of frequencies 1903 that are attenuated (e.g., not passed) by the microisolation system. For example, the microisolation system may attenuate the frequencies 1903 in the stop band 1911 by a factor of 10. In at least one embodiment, frequency 1903 attenuation may be characterized by a corresponding signal gain 1901 measuring less than 1.0. In one or more embodiments, the stop band 1911 may include frequencies 1903 measuring between about 1000-6000 Hz. In at least one embodiment, the stop band 1911 may include frequencies 1903 measuring greater than about 150 Hz.

Description of Finite Element Analysis and Modeling

The following section describes results of finite element analysis and modeling simulations analyzing behavior of sensors attached and unattached to microisolation systems described herein. The descriptions therein are provided for the purposes of illustrating performance criteria and other parameters of the present microisolation systems. All descriptions, embodiments, and the like are exemplary in nature and place no limitations on any embodiment described, or anticipated, herein or otherwise.

With reference to FIG. 20, shown is a chart 2000 relating displacement 2001 and time 2003. In at least one embodiment, the chart 2000 includes a mass curve 2005, a resonator curve 2007, and a saturation line 2009. In one or more embodiments, finite element analysis methods were used to model inertial sensors and subject the modeled inertial sensors to shock and vibrational forces to generate the mass curve 2005 and the resonator curve 2007. In at least one embodiment, the mass curve 2005 and the resonator curve 2007 demonstrate that exemplary sensors (lacking microisolation systems described herein) may experience saturation due to excessive displacement 2001 caused by shock and vibrational forces. In one or more embodiments, sensor saturation may refer to instances where a signal of sufficient strength introduces noise to sensor readings such that other signals are rendered undetectable, or are otherwise poorly received and/or resolved. In various embodiments, the present microisolation systems may attenuate signals of frequencies that may cause sensor saturation, thereby providing for improved sensor performance.

With reference to FIG. 21, shown is a chart 2100 relating stress 2101 and time 2103. In at least one embodiment, the chart 2100 includes a mass curve 2105, a resonator curve 2107. In one or more embodiments, FEA methods were used to model sensor response to displacements caused by shocks and vibrations, thereby generating the mass curve 2105 and the resonator curve 2107. In at least one embodiment, the mass curve 2105 and the resonator curve 2107 demonstrate that exemplary sensors (lacking microisolation systems described herein) may experience large stresses 2101 due to displacements caused by shock and vibrational forces. In various embodiments, the present microisolation systems may reduce and limit sensor displacements caused by shock and vibrational forces, thereby providing for improved sensor performance.

With reference to FIG. 22, shown is a chart 2200 measuring position error 2201 in sensor models subjected to a shock input occurring at a time 2202. In at least one embodiment, the chart 2200 includes an isolated curve 2203 and a non-isolated curve 2205. In various embodiments, the isolated curve 2203 may represent response of a sensor model that includes a microisolation system, as described herein, for accommodating, dispersing and/or attenuating shocks. In one or more embodiments, the non-isolated curve 2205 may represent response of a sensor model that does not include a microisolation system as described herein and/or does not include any microisolation systems.

In various embodiments, the non-isolated curve 2205 demonstrates a large increase in position error 2201 in response to the shock input. In at least one embodiment, the isolated curve 2203 demonstrates no increase in position error 2201 in response to the shock input. Accordingly, the chart 2200 demonstrates that, in one or more embodiments, sensors including microisolation systems described herein may present improved shock response compared to performance of non-isolated sensors. In at least one embodiment, comparison of the isolated curve 2203 to the non-isolated curve 2205 demonstrates that embodiments of the present systems, assemblies, devices, methods, etc. for microisolation may advantageously reduce or accommodate cross-sensitivity of a sensor affixed thereto.

With reference to FIG. 23, shown is a chart 2300 measuring position error 2301 over time 2303 of a non-isolated sensor model subjected to random vibration. In one or more embodiments, the chart 2300 includes a trend 2305 that describes response of the non-isolated sensor model to the random vibration. In at least one embodiment, the trend 2305 indicates that the non-isolated sensor model demonstrates a large and increasing positon error 2301 in response to random vibration.

With reference to FIG. 24, shown is a chart 2400 measuring position error 2401 over time 2403 of an isolated sensor model subjected to random vibrations. In one or more embodiments, the chart 2400 includes a trend 2405 that describes response of the isolated sensor model to the random vibration. In at least one embodiment, the trend 2405 indicates that the isolated sensor model did not demonstrate a significant increase in position error 2401 in response to random vibration. Accordingly, the chart 2400, in comparison to the chart 2300, demonstrates that sensors incorporating the present microisolation systems may maintain bias throughout vibration events, while sensor lacking the present microisolation systems may experience undesirable position errors throughout vibration events.

CONCLUSION

While various aspects have been described in the context of a preferred embodiment, additional aspects, features, and methodologies of the claimed inventions will be readily discernible from the description herein, by those of ordinary skill in the art. Many embodiments and adaptations of the disclosure and claimed inventions other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed inventions. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed inventions. In addition, some steps may be carried out simultaneously, contemporaneously, or in synchronization with other steps.

The embodiments were chosen and described in order to explain the principles of the claimed inventions and their practical application so as to enable others skilled in the art to utilize the inventions and various embodiments and with various modifications as are suited to the particular use contemplated. Alternative embodiments will become apparent to those skilled in the art to which the claimed inventions pertain without departing from their spirit and scope. Accordingly, the scope of the claimed inventions is defined by the appended claims rather than the foregoing description and the exemplary embodiments described therein.

What is claimed is:

1. An assembly for isolating a MEMS-based sensor, comprising:
    an isolator platform configured to hold the MEMS-based sensor;
    one or more springs affixed to the isolator platform;
    a frame affixed to the one or more springs; and
    a mesh damper affixed to a bottom surface of the frame.

2. An assembly for isolating a MEMS-based sensor, comprising an isolator platform configured to support the MEMS-based sensor;
    a frame surrounding the isolator platform; and
    one or more springs connected to the isolator platform and the frame, wherein:
        a thickness of the one or more springs is less than a thickness of the isolator platform and less than a thickness of the frame.

3. The assembly of claim 2, wherein the one or more springs comprise a spring constant measuring between about 50-150 nm on-axis displacement per 1 G on-axis acceleration and less than about 2.5 nm orthogonal displacement per 1 G on-axis acceleration.

4. The assembly of claim 3, wherein the spring constant is about 50-150 nm per 1 G acceleration.

5. The assembly of claim 2, further comprising a mesh damper affixed to the isolator platform.

6. The assembly of claim 5, wherein the mesh damper is affixed to a substrate.

7. The assembly of claim 5, wherein the mesh damper comprises a microfibrous mesh.

8. The assembly of claim 7, wherein the microfibrous mesh consists of metal.

9. The assembly of claim 8, wherein the metal comprises nickel.

10. An assembly for isolating a MEMS-based sensor, comprising:
    an isolator platform configured to hold the MEMS-based sensor;
    a frame affixed to the isolator platform; and
    a damper affixed to the frame, wherein the damper comprises a mesh damper.

11. The assembly of claim 10, wherein the mesh damper is affixed to a substrate.

12. The assembly of claim 11, wherein the mesh damper comprises a microfibrous mesh.

13. The assembly of claim 12, wherein the microfibrous mesh consists of metal.

14. The assembly of claim 13, wherein the metal comprises nickel.

15. The assembly of claim 10, wherein the assembly further comprises:
    one or more springs affixed to the isolator platform on a first end and affixed to the frame on a second end, wherein the one or more springs affix the frame to the isolator platform;
    an intermediate platform surrounding the isolator platform;
    an outer platform surrounding the intermediate platform;
    one or more second springs affixed to and connecting the isolator platform to the intermediate platform; and
    one or more third springs operatively connecting the intermediate platform to the outer platform.

16. The assembly of claim 10, wherein the assembly further comprises tuning material disposed between a portion of a top surface of the damper and a bottom surface of the frame.

17. The assembly of claim 16, wherein the tuning material modifies a power spectral density and a shock response spectrum of the assembly.

18. The assembly of claim 10, wherein the assembly has a cut-off frequency of about 600 Hz and a sway of at least 400 microns.

19. The assembly of claim 18, wherein the assembly has a quality factor of about 5 and a stop band attenuation of about 10×.

20. An assembly for isolating a MEMS-based sensor, comprising:
    an isolator platform configured to support the MEMS-based sensor;
    a mesh damper affixed to the isolator platform;
    a frame surrounding the isolator platform; and
    one or more springs, wherein:
        the one or more springs are affixed, at a first end, to the isolator platform; and
        the one or more springs are operatively connected, at a second end opposite the first end, to the frame.

* * * * *